United States Patent
Ogushi et al.

(10) Patent No.: US 9,609,223 B2
(45) Date of Patent: Mar. 28, 2017

(54) IMAGE PICKUP ELEMENT, IMAGE PICKUP APPARATUS, AND METHOD AND PROGRAM FOR CONTROLLING THE SAME

(71) Applicant: CANON KABUSHIKI KAISHA, Tokyo (JP)

(72) Inventors: Naoto Ogushi, Yokohama (JP); Shinobu Watanabe, Kawasaki (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 0 days.

(21) Appl. No.: 14/141,732

(22) Filed: Dec. 27, 2013

(65) Prior Publication Data

US 2014/0184866 A1    Jul. 3, 2014

(30) Foreign Application Priority Data

Dec. 28, 2012   (JP) ................. 2012-288036
Jun. 28, 2013   (JP) ................. 2013-136083
Jun. 28, 2013   (JP) ................. 2013-137031

(51) Int. Cl.
H04N 5/232    (2006.01)
H04N 5/235    (2006.01)
(Continued)

(52) U.S. Cl.
CPC ... H04N 5/23293 (2013.01); H01L 27/14634 (2013.01); H04N 5/2351 (2013.01);
(Continued)

(58) Field of Classification Search
CPC .... H04N 5/23212; H04N 5/374; H04N 5/378; H04N 5/343; H04N 5/345;
(Continued)

(56) References Cited

U.S. PATENT DOCUMENTS

2008/0291311 A1*  11/2008  Kusaka ................. 348/308
2009/0086084 A1    4/2009  Komaba et al.
(Continued)

FOREIGN PATENT DOCUMENTS

CN    101510040 A    8/2009
EP    1227662 A2     7/2002
(Continued)

OTHER PUBLICATIONS

U.K. Search/Examination Report issued on Jun. 30, 2014, that issued in the corresponding U.K. Patent Application No. 1322878.8.
(Continued)

*Primary Examiner* — Paul Berardesca
(74) *Attorney, Agent, or Firm* — Cowan, Liebowitz & Latman, P.C.

(57) ABSTRACT

An image pickup element generates an AF evaluation value to be used for image-pickup in accordance with an image signal corresponding to a voltage signal obtained from a first pixel group among a plurality of pixels. The image pickup element further outputs an image signal corresponding to a voltage signal obtained from a second pixel group among the plurality of pixels as a live-view display signal for image display. In accordance with the AF evaluation value, a control unit controls a mechanical optical unit having a focus lens and performs live-view display on an image display unit in accordance with the live-view display signal.

19 Claims, 22 Drawing Sheets

(51) Int. Cl.
*H04N 5/343* (2011.01)
*H04N 5/378* (2011.01)
*H01L 27/146* (2006.01)

(52) U.S. Cl.
CPC ......... *H04N 5/23212* (2013.01); *H04N 5/343* (2013.01); *H04N 5/378* (2013.01)

(58) Field of Classification Search
CPC ............... H04N 5/369; H04N 5/23293; H04N 5/23245; H04N 5/2351; H04N 5/341–5/3458; H01L 27/14634–27/14638
See application file for complete search history.

(56) References Cited

U.S. PATENT DOCUMENTS

| | | | |
|---|---|---|---|
| 2009/0135289 A1* | 5/2009 | Kusaka | 348/345 |
| 2009/0140122 A1* | 6/2009 | Suzuki | 250/201.2 |
| 2009/0180012 A1 | 7/2009 | Ino | |
| 2009/0207264 A1* | 8/2009 | Utsugi | 348/222.1 |
| 2012/0307130 A1 | 12/2012 | Usui | |
| 2013/0100326 A1* | 4/2013 | Ueno | 348/300 |
| 2013/0215290 A1* | 8/2013 | Solhusvik | H04N 5/2355 348/231.99 |
| 2013/0258149 A1* | 10/2013 | Choi et al. | 348/294 |

FOREIGN PATENT DOCUMENTS

| | | |
|---|---|---|
| JP | 2008-263352 A | 10/2008 |
| JP | 2009-089105 A | 4/2009 |
| JP | 2009-303194 A | 12/2009 |

OTHER PUBLICATIONS

British Office Action issued on Aug. 14, 2015, that issued in the corresponding U.K. Patent Application No. GB1322878.8.
British Search Report issued on Dec. 16, 2015, that issued in the corresponding U.K. Patent Application No. 1519148.9.
Aug. 31, 2016 Chinese Office Action, with an English Translation, that issued in Chinese Patent Application No. 201310745423.1.

\* cited by examiner

FIG. 3

| | | | | | | ROW NUMBER | ROWS TO BE SELECTED FOR AF | ROWS TO BE SELECTED FOR LIVE VIEW |
|---|---|---|---|---|---|---|---|---|
| R | Gr | R | Gr | R | Gr | 1 | ○ | |
| Gb | B | Gb | B | Gb | B | 2 | ○ | |
| R | Gr | R | Gr | R | Gr | 3 | | ○ |
| Gb | B | Gb | B | Gb | B | 4 | | ○ |
| R | Gr | R | Gr | R | Gr | 5 | | ○ |
| Gb | B | Gb | B | Gb | B | 6 | | ○ |
| R | Gr | R | Gr | R | Gr | 7 | | ○ |
| Gb | B | Gb | B | Gb | B | 8 | | ○ |

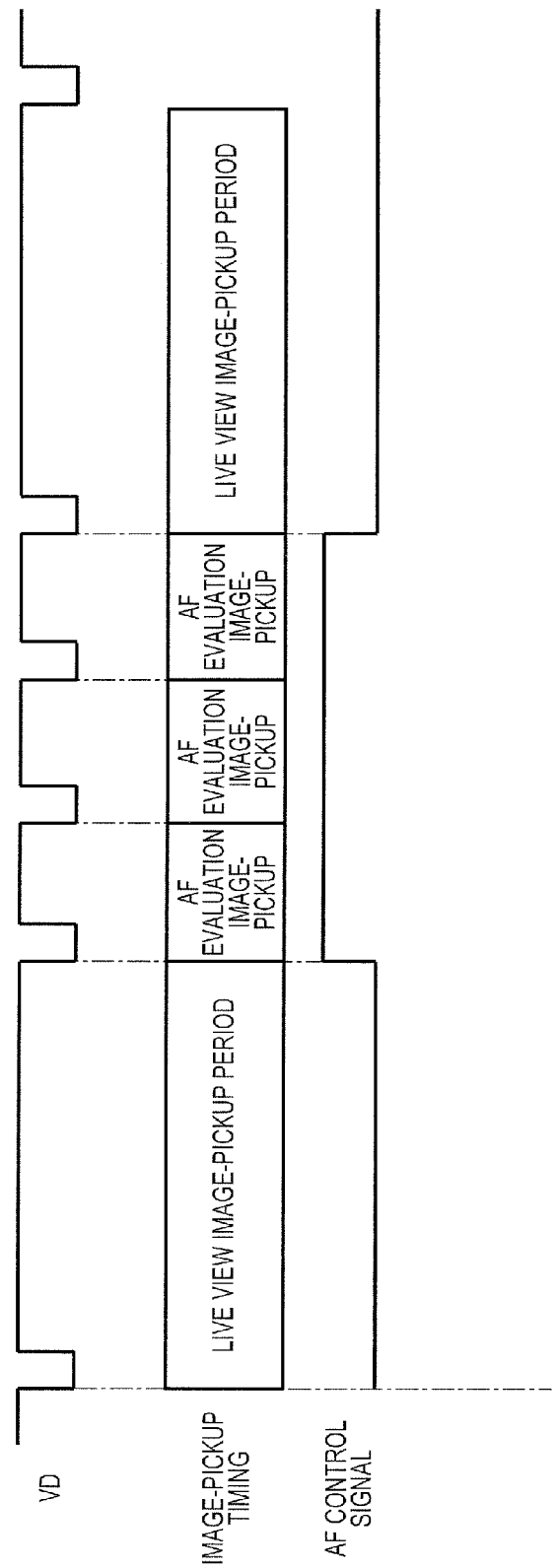

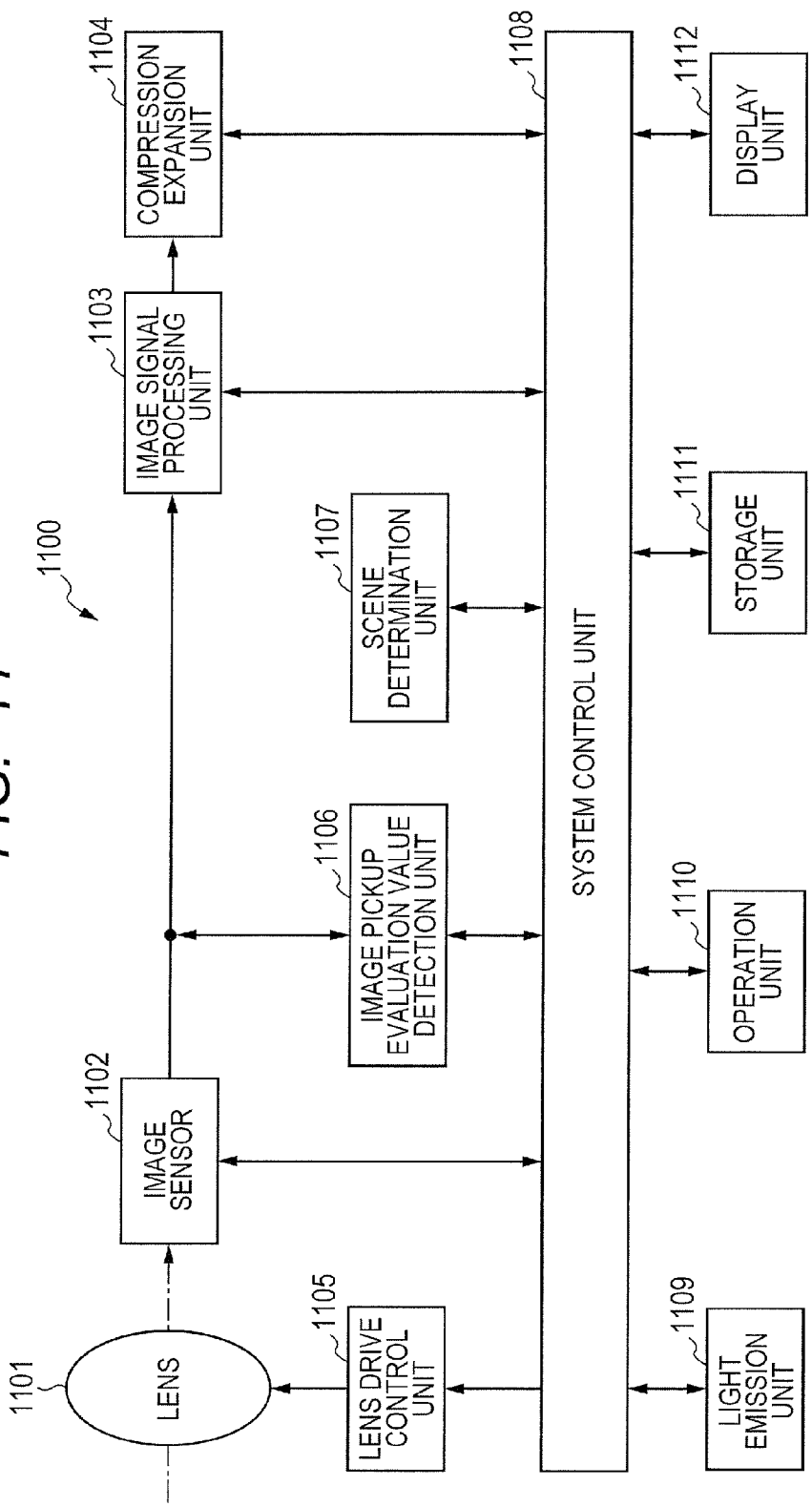

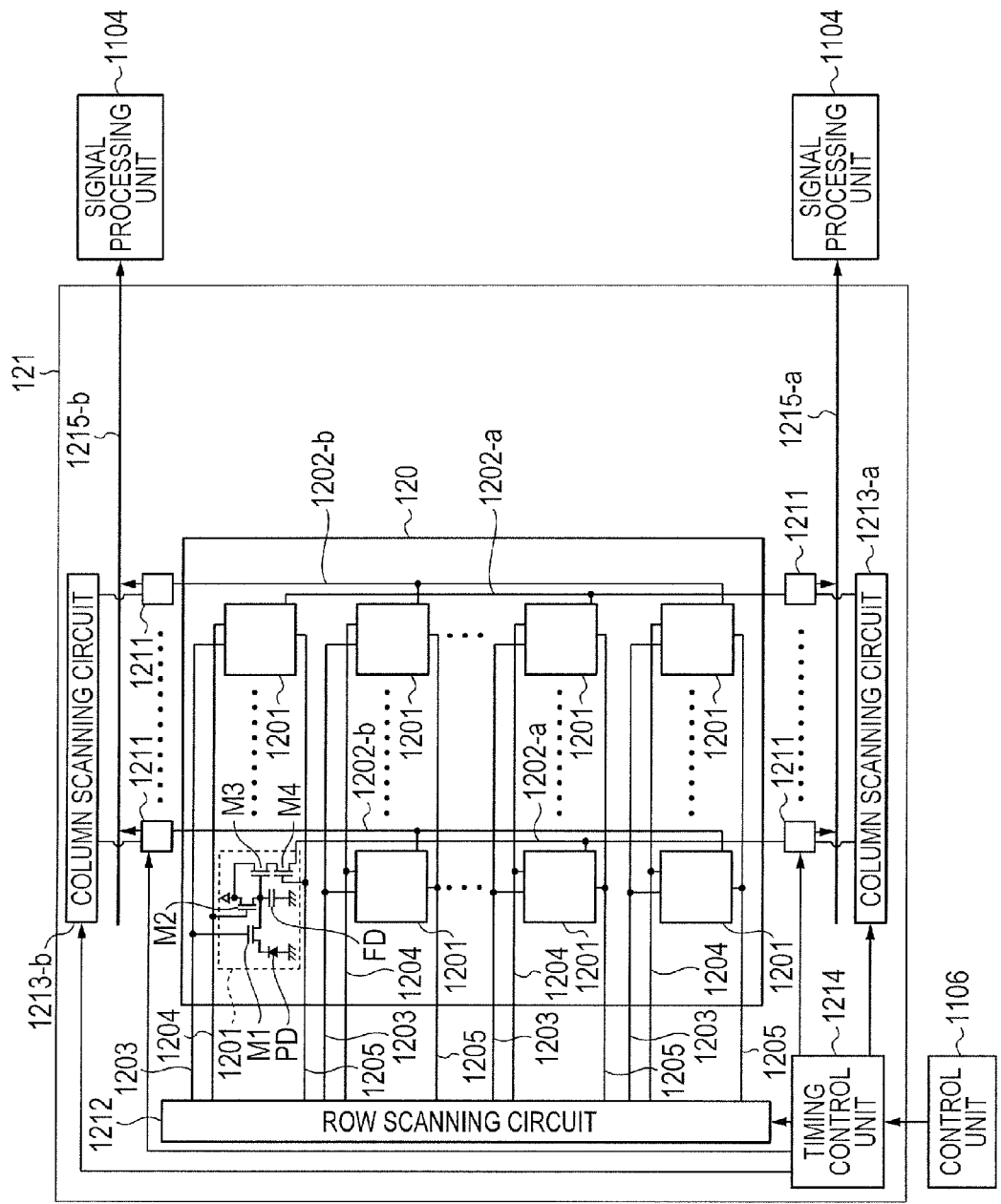

FIG. 13

| | | | | | | ROW NUMBER | ROWS TO BE SELECTED FOR IMAGE-PICKUP EVALUATION VALUE | ROWS TO BE SELECTED FOR DISPLAY |
|---|---|---|---|---|---|---|---|---|
| R | Gr | R | Gr | R | Gr | 1 | ○ | |
| G | B | G | B | G | B | 2 | ○ | |
| R | Gr | R | Gr | R | Gr | 3 | | ○ |
| G | B | G | B | G | B | 4 | | ○ |
| R | Gr | R | Gr | R | Gr | 5 | | ○ |
| G | B | G | B | G | B | 6 | | ○ |
| R | Gr | R | Gr | R | Gr | 7 | | ○ |
| G | B | G | B | G | B | 8 | | ○ |

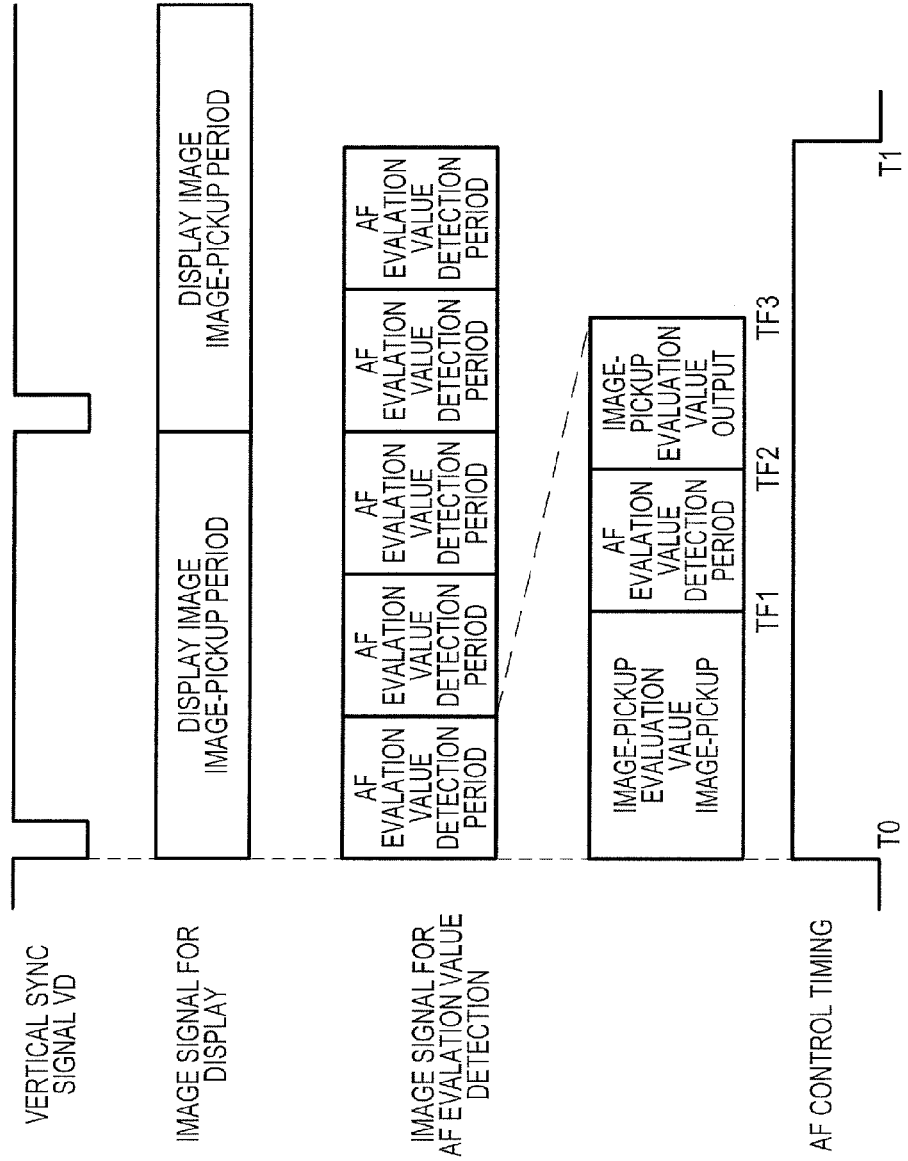

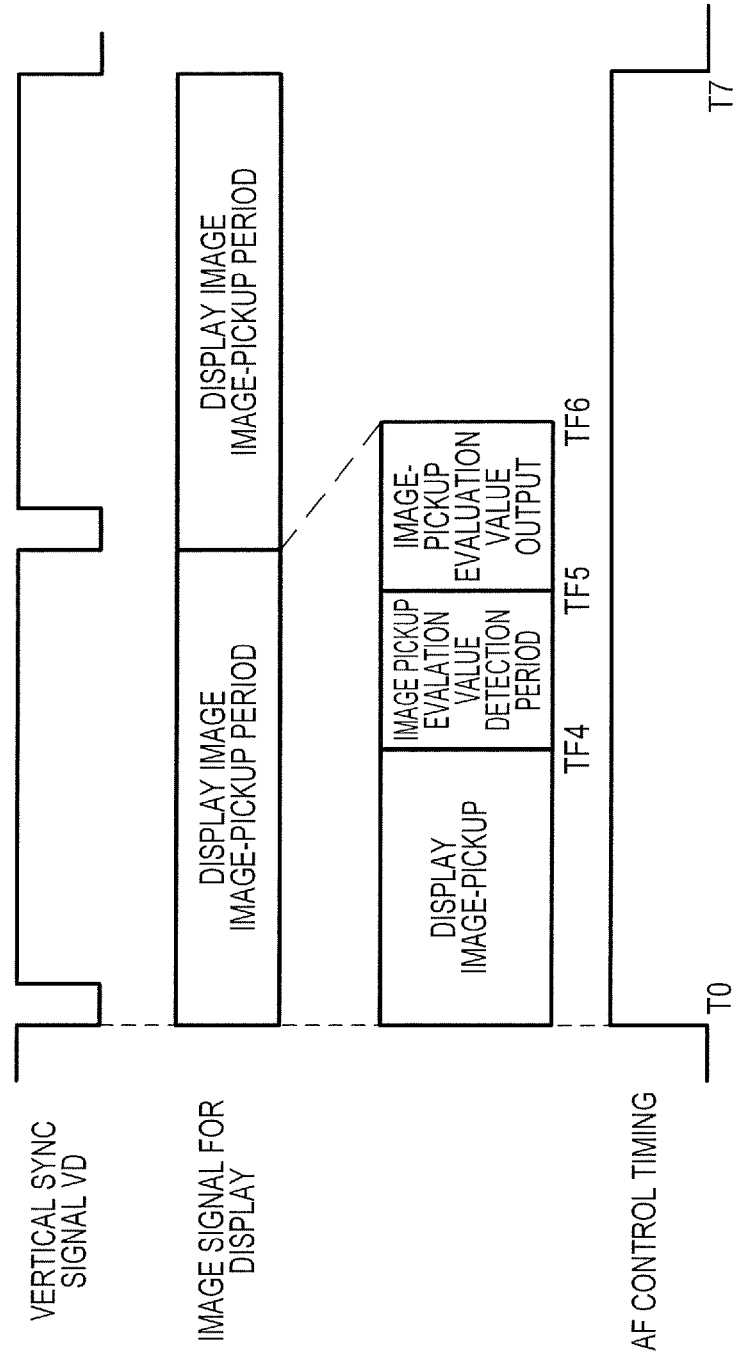

FIG. 18

| FACE INFORMATION [X] | X1 > X | | | | X1 ≤ X | | | |
|---|---|---|---|---|---|---|---|---|
| LUMINANCE INFORMATION [Y] | Y1 > Y | | Y1 ≤ Y | | Y1 > Y | | Y1 ≤ Y | |
| CHROMINANCE INFORMATION [Z] | Z1 > Z | Z1 ≤ Z | Z1 > Z | Z1 ≤ Z | Z1 > Z | Z1 ≤ Z | Z1 > Z | Z1 ≤ Z |
| AF EVALUATION VALUE | AF_Kα | | AF_Kβ | | AF_Kα | | AF_Kβ | |

IMAGE PICKUP ELEMENT, IMAGE PICKUP APPARATUS, AND METHOD AND PROGRAM FOR CONTROLLING THE SAME

BACKGROUND OF THE INVENTION

Field of the Invention

The present invention relates to an image pickup element having a layered structure, an image pickup apparatus including the image pickup element, and a method and program for controlling the same. More particularly, the present invention relates to an image pickup apparatus that can detect an evaluation value for photometry, distance measurement and the like in accordance with an image signal.

Description of the Related Art

There is a technology for evaluating and displaying an image by using a signal picked up by an image pickup apparatus. An apparatus disclosed in Japanese Patent Application Laid-Open No. 2009-89105 discloses a live-view readout mode and a focus-detection auto-exposure readout mode. The live-view readout mode is to read out an image-pickup signal for live-view display, while the focus-detection auto-exposure readout mode is to read out, from an image pickup element, an image-pickup signal to be used for a signal for focus detection and photometry information for auto-exposure. These readout modes are cyclically repeated in every frame.

However, since an image signal (i.e. charge) is read out from the image pickup element on a pixel basis in Japanese Patent Application Laid-Open No. 2009-89105, not only a longer time is taken for transferring the charge, but also the amount of data transfer is increased, which increases power consumption.

Further, the image signal that is the output of the image pickup element is subjected to image signal processing performed by another apparatus such as a controller. Accordingly, a large transfer data amount causes increase in processing load of the controller.

In addition, Japanese Patent Application Laid-Open No. 2009-89105 discloses a pixel unit including focus signal detection pixels, which unavoidably decreases an area allotted for the pixels for the image-pickup signal. Since those focus signal detection pixels are not used in obtaining the image-pickup signal (image signal), image quality is deteriorated.

Accordingly, an object of the present invention is to provide an image pickup element and an image pickup apparatus that reduce data transfer time and suppress deterioration in image quality, and a method and program for controlling the same.

SUMMARY OF THE INVENTION

In order to accomplish the above-stated object, according to the invention, an image pickup element for pick up of an optical image focused thereon and outputting an image signal corresponding to the optical image, comprises: first element means comprising a plurality of pixels arrayed in a matrix, for outputting a voltage signal corresponding to the optical image; and second element means for converting the voltage signal into a digital signal to obtain the image signal, wherein the second element means comprises: control information generation means for generating control information to be used for image-pickup in accordance with a first image signal which is an image signal obtained from a first pixel group among the plurality of pixels; and output means for outputting, as an image display signal for image display, a second image signal which is an image signal obtained from a second pixel group among the plurality of pixels. There is provided an image pickup element according to any of claims 1 to 5.

In another aspect of the invention, an image pickup apparatus, comprises: the image pickup element described above; control means for controlling, upon receipt of the control information, image-pickup in accordance with the control information; and display control means for performing live-view display in accordance with the image display signal.

Further features of the present invention will become apparent from the following description of embodiments with reference to the attached drawings.

BRIEF DESCRIPTION OF THE DRAWINGS

FIG. 3 is an explanatory view illustrating pixel selection in column signal lines on a first chip illustrated in FIGS. 2A and 2B.

FIG. 10 is an explanatory view illustrating timing of auto-focus image-pickup operation for live view in a conventional image pickup apparatus.

FIG. 11 is a block diagram illustrating the configuration of an image pickup apparatus according to a fourth embodiment of the present invention.

FIGS. 12A and 12B illustrate the configuration of an image pickup element included in the image pickup apparatus according to the fourth embodiment of the present invention.

FIG. 13 is an explanatory view illustrating readout configuration of a pixel unit in an image pickup element to be used in the image pickup apparatus according to the fourth example of the present invention.

FIGS. 14A and 14B illustrate image-pickup timing of the image pickup apparatus according to the fourth embodiment of the present invention.

FIG. 18 is a determination table showing scene determination in the image pickup apparatus according to the fifth embodiment of the present invention.

DESCRIPTION OF THE EMBODIMENTS

Various embodiments, features, and aspects of the present invention will be described in detail below with reference to the drawings. One example of the image pickup apparatus according to the embodiments of the present invention will be described below with reference to the drawings.

First Embodiment

Figure 1:
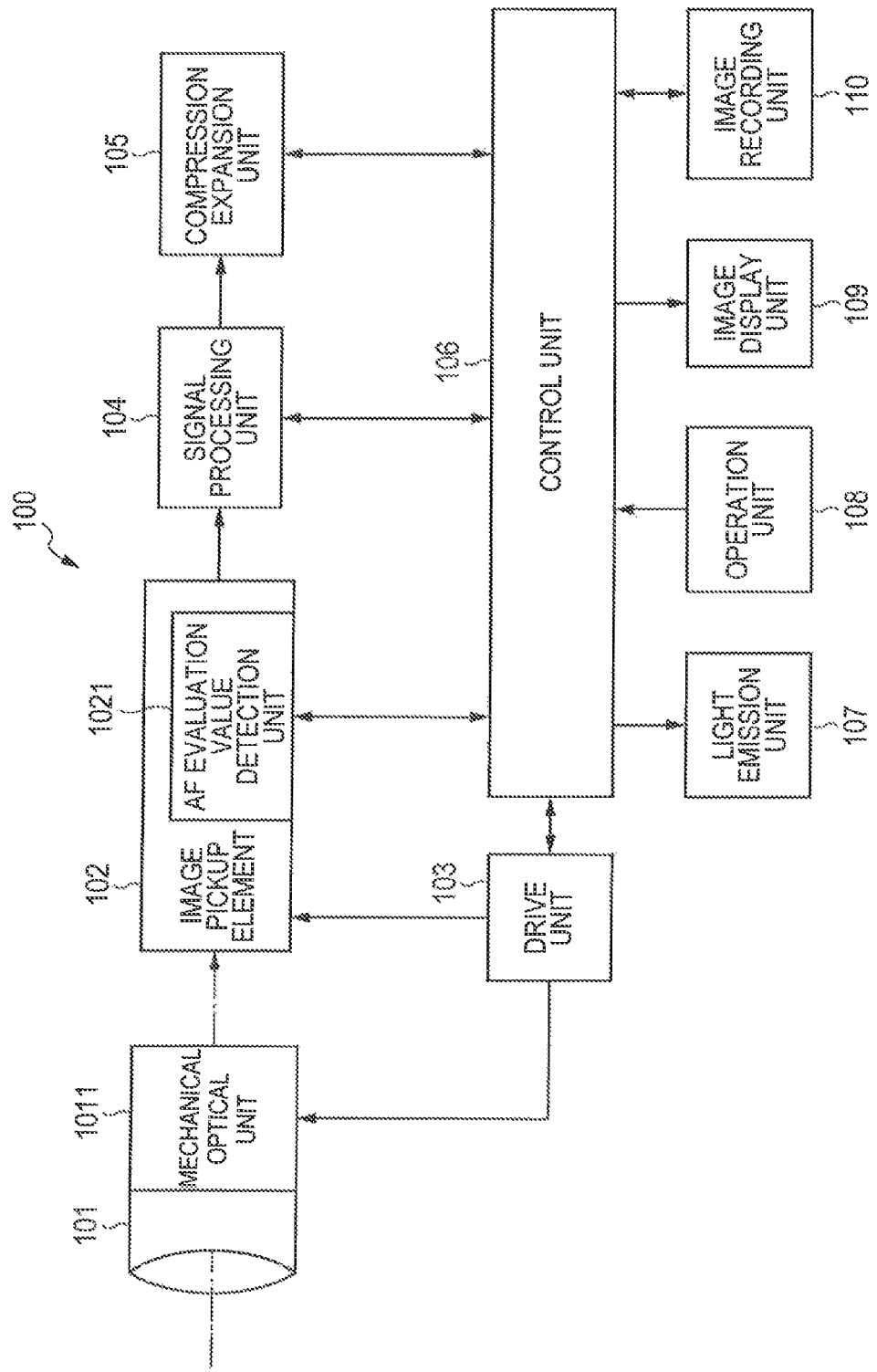
FIG. 1 is a block diagram illustrating the configuration of one example of an image pickup apparatus in a first embodiment of the present invention.

FIG. 1 is a block diagram illustrating the configuration of one example of an image pickup apparatus in a first embodiment of the present invention.

For example, the illustrated image pickup apparatus is applied to a digital still camera with a moving image function or a video camera.

The image pickup apparatus 100 has an optical barrel 101, an image pickup element 102, a drive unit 103, a signal processing unit 104, a compression expansion unit 105, a control unit 106, a light emission unit 107, an operation unit 108, an image display unit 109, and an image recording unit 110.

The optical barrel 101 includes a lens unit (not illustrated, hereinbelow simply referred to as a lens) and a mechanical optical unit 1011. The lens concentrates (i.e. images) light from an object (an optical image) onto the image pickup element 102.

Although not illustrated, the mechanical optical unit 1011 includes an AF mechanic, a zoom drive mechanic, a mechanical shutter mechanic and an iris mechanic. The mechanical optical unit 1011 is driven by the drive unit 103 under the control of the control unit 106.

The image pickup element 102 has a later-described pixel unit 201 and an A/D converter (not illustrated). For example, the image pickup element 102 is a so-called XY read-type CMOS image sensor. The image pickup element 102 performs image-pickup operation, such as exposure, signal readout and reset, with the aid of the drive unit 103 which operates under the control of the control unit 106. The image pickup element 102 also outputs an image-pickup signal (also referred to as an image signal).

The image pickup element 102 has an AF evaluation value detection unit 1021. The AF evaluation value detection unit 1021 detects an AF evaluation value (auto-focus evaluation value) with the timing controlled by the control unit 106, based on contrast information and phase-difference information obtained in accordance with the image signal that is obtained in the image pickup element 102. The AF evaluation value detection unit 1021 outputs the AF evaluation value to the control unit 106.

Under the control of the control unit 106, the signal processing unit 104 performs signal processing, such as white balance adjustment processing, color correction processing and auto exposure (AE) processing, on the image signal that is the output of the image pickup element 102, and outputs the image signal as image data.

The compression expansion unit 105, which operates under the control of the control unit 106, carries out a compression coding process in a specified still image data format, such as a JPEG (Joint Photographic Coding Experts Group) method, on the image data that is the output of the signal processing unit 104. The compression expansion unit 105 also carries out an expansion decoding process of the coded image data sent from the control unit 106.

The compression expansion unit 105 may also perform compression coding/expansion decoding processes on the moving image data by using a MPEG (Moving Picture Experts Group) method.

The control unit 106 is a microcontroller including, for example, a central processing unit (CPU), a read only memory (ROM) and a random access memory (RAM). The CPU executes a program stored in the ROM, so that the entire image pickup apparatus 100 is comprehensively controlled.

When it is determined that an exposure value of an object is low due to AE processing performed by the signal processing unit 104, the light emission unit 107 emits light to illuminate the object. For example, a strobe apparatus using a xenon tube or an LED light emitting device may be used as the light emission unit 107.

For example, the operation unit 108 has various operation keys, levers and dials, such as a shutter release button, to give a manipulate signal corresponding to user input operation to the control unit 106.

The image display unit 109 includes, for example, a display device such as a liquid crystal display (LCD) and an interface circuit for the LCD, and displays, on the display device, an image corresponding to the image data sent from the control unit 106.

The image recording unit 110 is, for example, a recording medium such as a portable semiconductor memory, an optical disk, a hard disk drive (HDD) or a magnetic tape to store image data, which is compression-coded by the compression expansion unit 105, as an image file. The image recording unit 110 also reads out an image file specified by the control unit 106, and outputs it to the control unit 106.

Now, the basic operation of the image pickup apparatus 100 illustrated in FIG. 1 is described.

For example, in the case of photographing a still image, as a preparation for image pickup, image signals output from the pixels 201 are sequentially subjected to CDS processing and AGC processing in the image pickup element 102. The image signals are then converted into digital image signals in the A/D converter. The obtained digital image signals are output to the AF evaluation detection unit 1021 and the signal processing unit 104.

The AF evaluation value detection unit 1021 calculates an AF evaluation value (control information) in accordance with the contrast information obtained from the digital image signals, and outputs the AF evaluation value to the control unit 106. The control unit 106 determines a control amount of the mechanical optical unit 1011 based on the AF evaluation value, and controls the drive unit 103 in accordance with the control amount. As a consequence, the mechanical optical unit 1011 is driven by the drive unit 103.

The signal processing unit 104 applies, for example, image quality correction processing, to the above-described digital image signal to generate a camera through-image signal, and sends the camera through-image signal to the image display unit 109 via the control unit 106. As a consequence, the image display unit 109 can display a camera through image corresponding to the camera through-image signal, so that a user can perform image angle adjustment while viewing the camera through image.

When the shutter release button of the operation unit 108 is depressed in this state, an image-pickup signal (digital image signal) of one frame from the image pickup element 102 is taken into the signal processing unit 104 under the control of the control unit 106. The signal processing unit 104 applies image quality correction processing to the digital image signal of the one frame and sends the processed digital image signal (image data) to the compression expansion unit 105.

The compression expansion unit 105 carries out image data compression coding, and sends the coded image data to the image recording unit 110 via the control unit 106. As a consequence, an image file relating to the picked-up still image is recorded onto the image recording unit 110.

In the case of reproducing an image file recorded on the image recording unit 110, the control unit 106 reads the image file, selected in accordance with manipulated input from the operation unit 108, from the image recording unit 110. The control unit 106 then sends the image file to the compression expansion unit 105, where an expansion decoding process is executed.

The decoded image data is sent to the image display unit 109 via the control unit 106. As a consequence, a still image corresponding to the image data is reproduced and displayed on the image display unit 109.

In the case of recording moving image data, digital image signals output from the image pickup element 102 under control of the control unit 106 are taken into the signal processing unit 104. The image data processed in sequence in the signal processing unit 104 is subjected to a compression coding process in the compression expansion unit 105. The coded moving image data is then transferred in sequence from the compression expansion unit 105 to the image recording unit 110, where the data is recorded as a moving image file.

In the case of reproducing a moving image file recorded on the image recording unit 110, the control unit 106 reads the selected moving image file from the image recording unit 110 in accordance with manipulated input from the operation unit 108. The control unit 106 then sends the moving image file to the compression expansion unit 105, where an expansion decoding process is executed. The decoded moving image data is sent to the image display unit 109 via the control unit 106. As a consequence, a moving image corresponding to the moving image data is reproduced and displayed on the image display unit 109.

Now, a technology for displaying a display image while calculating an evaluation value from a picked up image in a conventional image pickup apparatus is described together with a problem relating thereto. To obtain position information on an object to be used for focus control in the conventional image pickup apparatus, the position information is obtained in accordance with image signals output from an image pickup element. The position information is also obtained by directly inputting optical signals from an object into a dedicated detector and using a phase difference in images indicated by the optical signals. In the case where the position information is obtained in accordance with the image signals, the image pickup apparatus can be downsized because the dedicated detector is not necessary.

FIG. 10 is an explanatory view illustrating timing of auto-focus image-pickup operation (AF evaluation image-pickup) for live view in the conventional image pickup apparatus.

In the conventional image pickup apparatus, image-pickup timing is stipulated by a vertical sync signal (Vertical Driving Pulse: VD). When an AF control signal is turned on, an image for AF evaluation is picked up in accordance with the VD after a live view image-pickup period. When the AF control signal is turned off, the live view image-pickup period starts again.

In this way, since the live view image-pickup period for obtaining images for live view and the AF operation period for obtaining images for AF evaluation serially exist along a time axis, the image for live view and the image for AF evaluation cannot be picked up at the same time.

Because of this reason, images for AF evaluation are picked up during the AF operation period positioned in between the live view periods (frames) as illustrated. As a result, a time lag is produced between the image for live view and the image for AF evaluation.

In addition, although live-view display is performed even during image-pickup of the images for AF evaluation, the live-view display in this case is performed in accordance with the image for AF evaluation. As illustrated in FIG. 10, when the image for AF evaluation is picked up, the frame rate thereof is made higher than that in the live view image-pickup period. This increases a thinning-out rate in readout in the image pickup element, resulting in unavoidable deterioration in image quality. In order to avoid this problem, some image pickup element has a pixel unit in which, for example, pixels for focus signal detection are provided separately from the pixels for image-pickup signals.

Figure 2A:
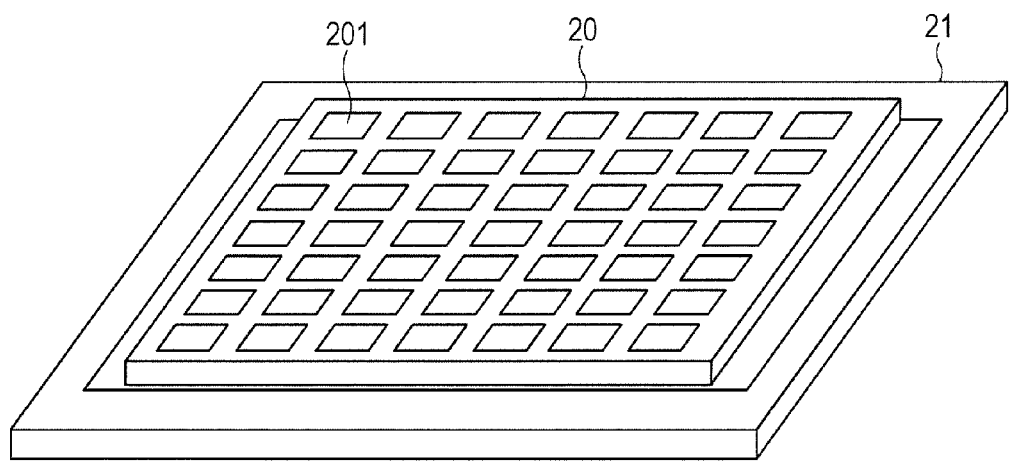
FIGS. 2A and 2B are explanatory views illustrating the configuration of an image pickup element illustrated in FIG. 1.
Figure 2B:
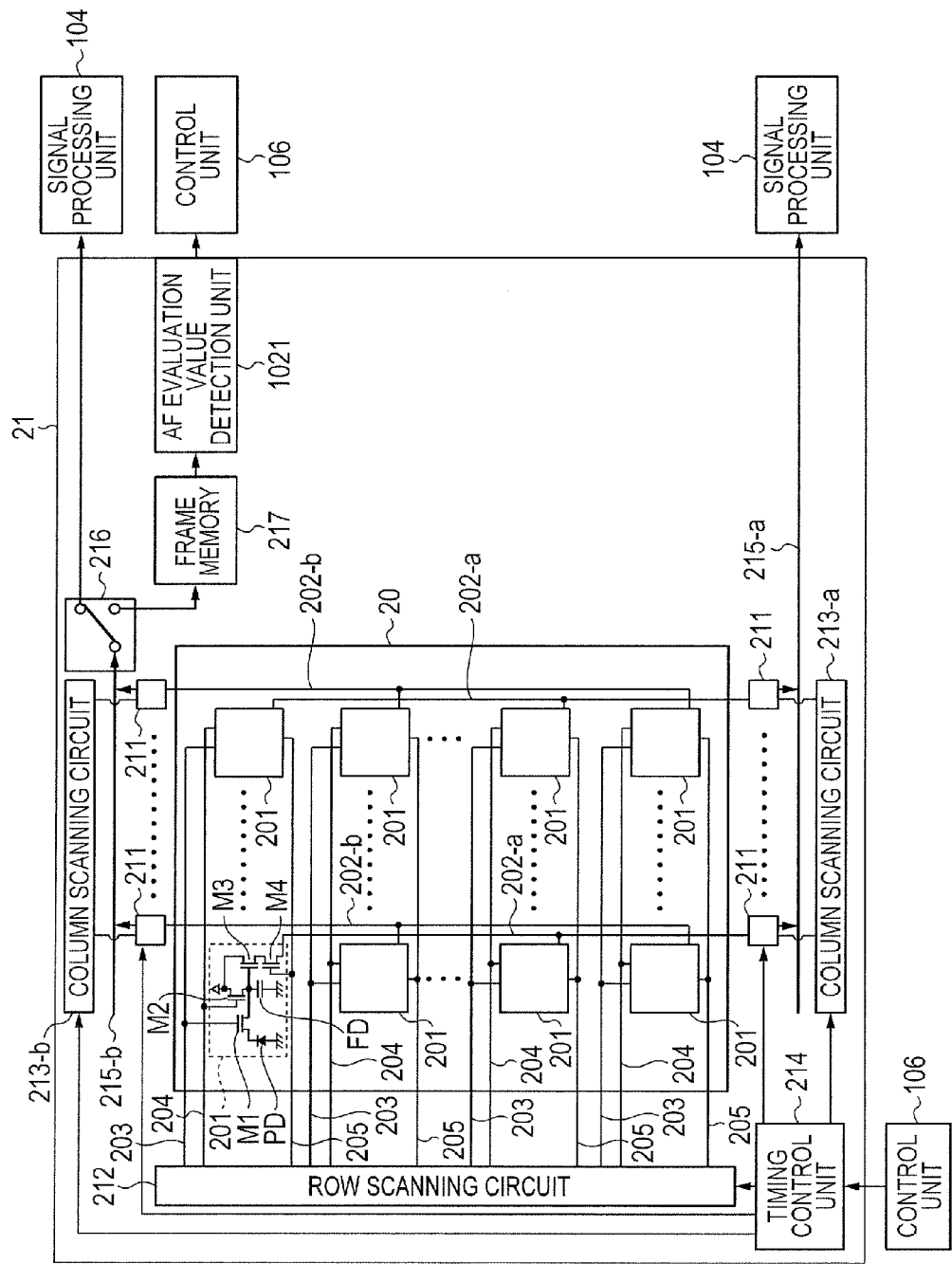

In view of the above-stated problem, the present embodiment provides the image pickup element 102 as illustrated in FIGS. 2A and 2B. The image pickup element 102 is configured to generate, in parallel with image signals for display, an evaluation value obtained from image signals or control information based on the evaluation value so as to shorten processing time and to reduce a processing load.

FIGS. 2A and 2B are explanatory views illustrating the configuration of the image pickup element 102 illustrated in FIG. 1. FIG. 2A is a perspective view illustrating the structure of the image pickup element 102, while FIG. 2B is a block diagram illustrating the configuration thereof.

In FIG. 2A, the image pickup element 102 has a first chip (pixel unit) 20 and a second chip 21. The first chip (first element unit) 20 is layered on top of the second chip (second element unit) 21. The first chip 20, which has a plurality of pixels 201 arrayed in a matrix form, is placed on the light incidence side (i.e., positioned on the side of receiving the optical image).

The second chip 21 has a pixel drive unit, including later-described column scanning circuits 213-$a$ and 213-$b$ and a row scanning circuit 212, formed thereon. The above-mentioned AF evaluation value detection unit (control information generation unit) 1021 is also formed on the second chip 21.

Since the pixels 201 are formed on the first chip 20 and the pixel drive unit and the AF evaluation value detection unit 1021 are formed on the second chip 21 in this way, manufacturing process of the peripheral circuits and the pixel unit of the image pickup element 102 can be separated. As a result, the tendency to narrowing wire width and highly-increasing wire density in the peripheral circuits can realize speed improvement, downsizing, and higher performance.

As illustrated in FIG. 2B, the pixels 201 are arrayed in a matrix form on the first chip 20. Each of the pixels 201 is connected to a transfer signal line 203, a reset signal line 204, and a row selection signal line 205 in a horizontal direction (row direction), and is also connected to column signal lines 202-a and 202-b in a vertical direction (column direction). Note that the column signal lines 202-a and 202-b are different from each other in connection destination on the basis of a row to be read out.

As illustrated, each of the pixels 201 has a photo diode PD that is a photoelectric conversion element, a transfer transistor M1, a reset transistor M2, an amplification transistor M3, a selecting transistor M4, and a floating diffusion FD.

In the illustrated example, each of the transistors is an n channel MOS field-effect transistor (MOS FET).

Gates of the transfer transistor M1, the reset transistor M2, and the selecting transistor M4 are connected to the transfer signal line 203, the reset signal line 204 and the row selection signal line 205, respectively. These signal lines 203 to 205 are arranged extendedly in the horizontal direction, and the pixels in the same row are simultaneously driven. In this way, operation of a rolling shutter of line sequential operation type can be controlled, so that image pickup can be performed with exposure time changed in every specified row. Or alternatively, operation of a global shutter of whole line simultaneous operation type can be controlled.

Further, a source of the selecting transistor M4 is connected to the column signal line 202-a or 202-b on a row basis.

The photo diode PD accumulates charge generated by photoelectric conversion. The P side of the photo diode PD is grounded while the N side is connected to the source of the transfer transistor M1. When the transfer transistor M1 is turned on, the charge of the photo diode PD is transferred to the FD. Since a parasitic capacitance exists in the FD, the charge transferred to the FD is accumulated.

A supply voltage Vdd is applied to a drain of the amplification transistor M3, while a gate of the amplification transistor M3 is connected to the FD. The amplification transistor M3 amplifies the charge (i.e., voltage) of the FD and converts it into a voltage signal (an electrical signal). The selecting transistor M4 is to select the pixels for reading out signals on a row basis. A drain of the selecting transistor M4 is connected to a source of the amplification transistor M3. A source of the selecting transistor M4 is connected to the column signal line 202.

When the selecting transistor M4 is turned on, a voltage signal corresponding to the voltage of the FD is output to the column signal line 202. The supply voltage Vdd is applied to a drain of the reset transistor M2, while a source of the reset transistor M2 is connected to the FD. When the reset transistor M2 is turned on, the voltage of the FD is reset to the supply voltage Vdd.

The second chip 21 includes a column ADC block 211, which is connected to the column signal line 202-a or 202-b. The second chip 21 further includes a row scanning circuit 212, column scanning circuits 213-a, and 213-b, a timing control unit 214, horizontal signal lines (output unit) 215-a and 215-b, a selector switch 216, a frame memory 217 and an AF evaluation value detection unit 1021.

The timing control unit 214 controls operation timing of the row scanning circuit 212, the column scanning circuits 213-a and 213-b, and the column ADC block 211 under the control of the control unit 106. The row scanning circuit 212 scans each row, while the column scanning circuits 213a and 213b scan each column, respectively.

The horizontal signal lines 215-a and 215-b transfer output signals (image signals) of the column ADC block 211 according to the timing controlled in each of the column scanning circuits 213-a and 213-b.

The frame memory 217 temporarily stores an image signal output from the horizontal signal line 215-b. The AF evaluation value detection unit 1021 performs AF evaluation in accordance with the image signal stored in the frame memory 217, and sends an AF evaluation value to the control unit 106.

The selector switch 216 is the switch that selectively outputs an image signal, which is output to the horizontal signal line 215-b, to any one of the AF evaluation value detection unit 1021 and the signal processing unit 104.

Note that the image signal transferred to the horizontal signal line 215-a is given to the signal processing unit 104.

FIG. 3 is an explanatory view illustrating pixel selection in the column signal line 202-a or 202-b on the first chip 20 illustrated in FIGS. 2A and 2B.

FIG. 3 illustrates a pixel unit of six rows×eight columns, in which the respective pixels are arranged according to the Bayer array.

When a focus control mode is turned on by operating the operation unit 108 illustrated in FIG. 1, the control unit 106 separates rows to be read out in the image pickup element 102 (i.e., controls switchover of the selector switch 216 so as to connect the horizontal signal line 215-b to the frame memory 217). As a result, image-pickup for live view (second image-pickup mode) and image-pickup for AF evaluation value detection (first image-pickup mode) can simultaneously be performed.

Consequently, an image signal for live view (second image signal or image display signal) is output to the column signal line 202-a, and an image signal for AF evaluation detection (a first image signal) is output to the column signal line 202-b.

In FIG. 3, rows with the row numbers 1 and 2 (first pixel group) are used for AF evaluation value detection image-pickup, while rows with the row numbers 3 to 8 (second pixel group) are used for live view image-pickup. In the illustrated example, reading scan is performed in sequence on a row basis, and every eight rows are repeatedly scanned to be read.

In the AF evaluation value detection image-pickup, thinning-out read of 3 out of 4 vertical same-color pixels (three lines out of four lines) is carried out as significance is placed on the frame rate. Meanwhile, in the live view image-pickup, the remaining 1 out of the 4 vertical same-color pixels (one line out of four lines) is thinned out and 3 pixels are added as significance is placed on image quality.

$$1_{i \in R} \in \{obj, bkg\}$$

$$1_{i \in R} \in \{obj, bkg\}$$

In other words, in the AF evaluation value detection image-pickup, the first pixel group is read out at a first frame rate. In the live view image-pickup, the second pixel group is read out at a second frame rate that is slower than the first frame rate.

As described in the foregoing, the AF scanning image-pickup and the live view image-pickup are separated on the basis of selected rows, so that image signals can be obtained in different charge storage time at the frame rates different in data size.

Next, a voltage signal (analog signal) output to the column signal lines 202-a and 202-b is converted from an analog signal into a digital signal (image signal) in the column ADC block 211 illustrated in FIG. 2B.

The image signal that is the output of the column ADC block 211 is read from the column ADC block 211 into the horizontal signal line 215-a or 215-b by the column scanning circuit 213-a or 213-b. The image signal read out to the horizontal signal line 215-a is sent to the signal processing unit 104.

Meanwhile, the image signal read into the horizontal signal line 215-b is output to the switch 216, and is output to the signal processing unit 104 or the frame memory 217 in accordance with the control of the control unit 106. Note that the selector switch 216 is switched on a frame basis.

In this case, since pixel signals are read out without thinning out in photographing of a still image, the switch 216 is switched to a path connected with the signal processing unit 104.

On the contrary, in the AF evaluation mode (i.e., in the auto-focus control mode), the image signal from the horizontal signal line 215-b is recorded on the frame memory 217 via the selector switch 216, and the AF evaluation value detection unit 1021 detects an AF evaluation value based on contrast information in the image signal recorded on the frame memory 217. The AF evaluation value is focus information of an object. The focus information includes contrast information, a defocus shift amount in an AF mechanic unit in the mechanical optical unit 1011, or control information of the AF mechanic unit. The AF evaluation value is sufficiently small in terms of data amount in comparison with multi-pixel AF evaluation value image data. The AF evaluation value is sent from the AF evaluation value detection unit 1021 to the control unit 106.

Thus, in the present embodiment, the AF evaluation value detection unit 1021 is incorporated in the chip 21 in order to achieve power saving, high speed processing, and low cost design. In most cases, the chip 21 and the signal processing unit 104 or the control unit 106 are arranged on separate substrates, which increases a resistance component and a capacitance component of interconnections in inter-chip communication. Accordingly, communication speed is degraded as compared with communication in intra-chip interconnections. In order to send out high-speed signals, increase in driving power is required so that the driving with use of an amplifier is necessary to maintain signal waveform quality, for example.

In the present embodiment, since the AF evaluation value detection unit 1021 is placed together with the chip 21 on the same semiconductor chip, a line to output image data can be made shorter and placement of the amplifier can also be omitted. In addition, since the AF evaluation value itself is small in data amount, time taken for communication between the image pickup element 102 and the control unit 106 is shortened and thereby reduction in power consumption can be achieved.

In the following description, at the time of image-pickup, an output pathway through the column signal line 202-a and the horizontal signal line 215-a is called a channel Ch1, while an output pathway through the column signal line 202-b and the horizontal signal line 215-b is called a channel Ch2.

Figure 4:
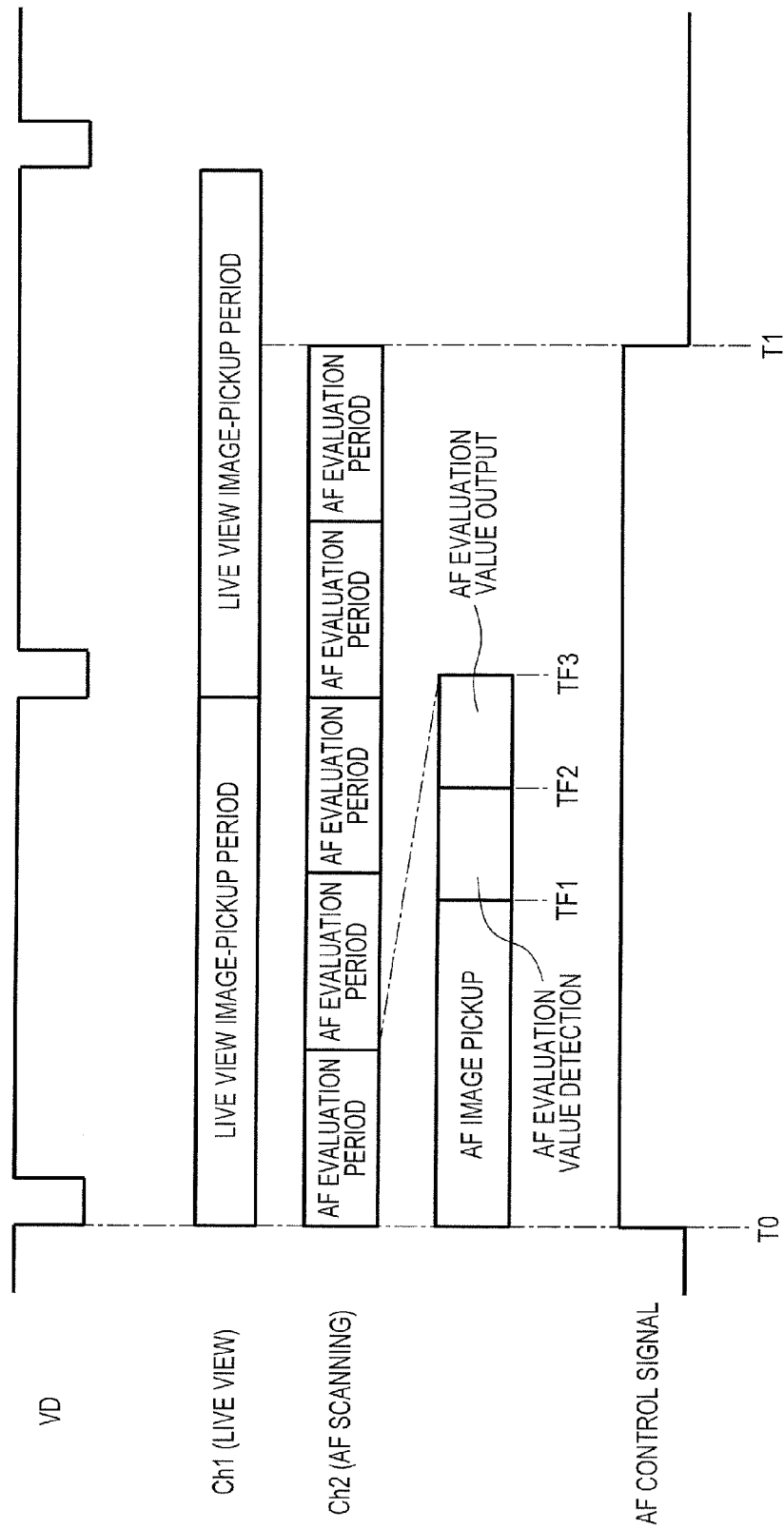
FIG. 4 is a timing chart for describing image-pickup timing in an AF evaluation mode in a camera illustrated in FIG. 1.

FIG. 4 is a timing chart for describing image-pickup timing in the AF evaluation mode in the camera 100 illustrated in FIG. 1.

As illustrated in FIG. 4, the image-pickup timing is stipulated by the vertical sync signal VD. When the AF evaluation mode is turned on, the control unit 106 concurrently starts an AF control signal, live view image-pickup with use of the channel Ch1, and AF evaluation image-pickup with use of the channel Ch2 at the falling edge of the vertical sync signal VD at time T0.

In a period from T0 to TF1, an image signal for AF evaluation that is read out from the pixel unit 20 via the channel Ch2 is stored in the frame memory 217 via the horizontal signal line 215-b and the selector switch 216. Then, in a period from TF1 to TF2, the AF evaluation value detection unit 1021 detects an AF evaluation value in accordance with the AF image signal stored in the frame memory 217. Then, in a period from TF2 to TF3, the AF evaluation value detection unit 1021 outputs the AF evaluation value to the control unit 106.

In the illustrated example, during a period of one vertical sync signal VD, an image for live view of one frame is picked up, while images for AF evaluation (AF scanning) of three frames are picked up. When the control unit 106 puts the vertical sync signal VD at L level (time T1), AF evaluation is completed.

As shown in the foregoing, the camera 100 illustrated in FIG. 1 does not need to send image data to the control unit 106 via the signal processing unit 104 to obtain the AF evaluation value in the AF evaluation mode. In other words, the AF evaluation value that is small in data amount is directly output from the image pickup element 102 to the control unit 106. As a result, a load is reduced so that power reduction can be achieved.

The control unit 106 compares the AF evaluation value with a later-described specified AF expected value, and makes the AF control signal (time T1) fall if the AF evaluation value satisfies the AF expected value. Once the AF control signal has fallen, only the AF evaluation image-pickup is terminated and live view image-pickup is continued.

Figure 5:
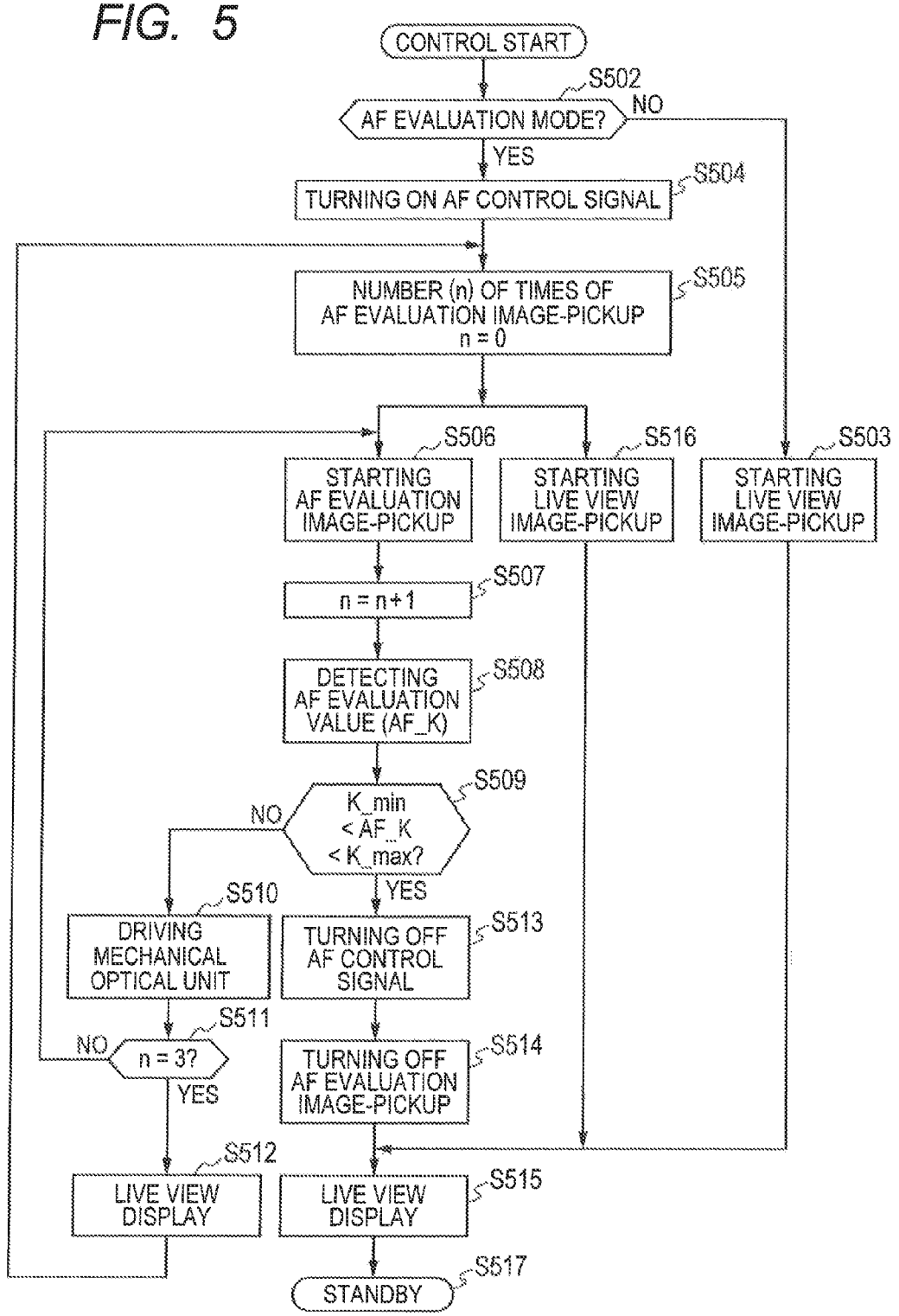
FIG. 5 is a flow chart for describing control in the camera illustrated in FIG. 1.

FIG. 5 is a flow chart for describing control in the camera 100 illustrated in FIG. 1. Note that the illustrated flow chart is performed under the control of the control unit 106.

When the power of the camera 100 is turned on and is put in a standby state (i.e., in a photographing preparation state before image-pickup), the control unit 106 determines whether or not the AF evaluation mode is in effect (step S502). In short, the control unit 106 determines whether or not the auto-focus mode is set.

If the AF evaluation mode is not in effect (NO in step S502), the control unit 106 starts live view image-pickup (step S503), and proceeds to step S515 described later.

If the AF evaluation mode is determined to be in effect (YES in step S502), the control unit 106 turns on the AF control signal (H level) (step S504). Next, the control unit 106 substitutes 0 into variable n to count the number of times of AF evaluation image-pickup (step S505).

Next, as described in FIG. 4, the control unit 106 starts the AF evaluation image-pickup (step S506), and also starts live view image-pickup in step S516.

After AF evaluation image-pickup is started, the control unit 106 increments the variable n by 1 (step S507). Then, under the control of the control unit 106, the AF evaluation value detection unit 1021 detects an AF evaluation value AF_K in accordance with the image signal for AF evaluation obtained in AF evaluation image-pickup (step S508).

Next, the control unit 106 determines whether or not the AF evaluation value AF_K satisfies Formula (1) with respect to AF expected values K_min and K_max, i.e., whether or not the AF evaluation value AF_K satisfies a specified evaluation condition (step S509).

$$K\_min < AF\_K < K\_max \quad (1)$$

where the AF expected values K_min and K_max represent an expected minimum value and maximum value of the AF evaluation value, which are pre-recorded on the control unit 106 in a design phase or in an adjustment phase of the camera 100.

If the AF evaluation value AF_K does not satisfy Formula (1) (NO in step S509), the control unit 106 calculates a feedback control amount in accordance with the above-described AF evaluation value AF_K. The control unit 106 then executes drive control of the drive unit 103 in accordance with the feedback control amount so as to drive a focus lens included in the mechanical optical unit 1011 along an optical axis (step S510).

Next, the control unit 106 determines whether or not variable (the number of times of AF evaluation value image-pickup) n is a specified number (3 in this case) (step S511). If the number of times of AF evaluation value image-pickup is less than 3 (NO in step S511), the control unit 106 returns to the processing of step S506, and performs AF evaluation image-pickup.

If the number of times of AF evaluation value image-pickup is 3 (YES in step S511), the control unit 106 performs live-view display (step S512), and then returns to the processing of step S505 to set the number of times of AF evaluation value image-pickup n to zero.

If the AF evaluation value AF_K satisfies Formula (1) (YES in step S509), the control unit 106 turns off the AF control signal (L level) (step S513), and terminates AF evaluation image-pickup in the image pickup element 102 (step S514). The control unit 106 then displays on the image display unit 109 an image corresponding to the picked-up image signal for live view (step S515), and the camera is put in a standby state (step S517).

In the flow chart illustrated in FIG. 5, after the AF evaluation image-pickup is terminated, the control unit 106 displays an image corresponding to the image signal obtained by live view image-pickup of step S516. Once the live view image-pickup of step S503 has started, the control unit 106 proceeds to the processing of step S515 to perform live-view display.

As described in the foregoing, in the first embodiment of the present invention, the AF evaluation value detection unit 1021 is included in the second chip 21. Accordingly, while images for live view are picked up, images for AF evaluation are picked up at a high frame rate and the AF evaluation values can be calculated and output. As a consequence, a time lag at the time of performing AF evaluation can be reduced.

Moreover, in AF evaluation, only the AF evaluation value small in data volume is directly sent from the image pickup element 102 to the control unit 106, so that a signal output load is reduced and power consumption can be decreased.

Although an example of AF performed during live view is described in the aforementioned embodiment, the above-described method can be used not only in live view but also in other moving image photographing.

Moreover, in the present embodiment, the AF evaluation value is directly output from the image pickup element 102 into the control unit 106, and the control unit 106 controls the mechanical optical unit 1011 with the drive unit 103 in accordance with the AF evaluation value. However, the drive unit 103 may perform drive control of the mechanical optical unit 1011 in accordance with the AF evaluation value.

Second Embodiment

Now, one example of a camera in a second embodiment of the present invention is described.

The configuration of the camera in the second embodiment is similar to that of the camera illustrated in FIG. 1 except that the configuration of an image pickup element 102 is different from the image pickup element illustrated in FIG. 2B. In the following description, still image photographing for photometry operation with the light emission unit, such as a strobe, will, be described.

Figure 6:
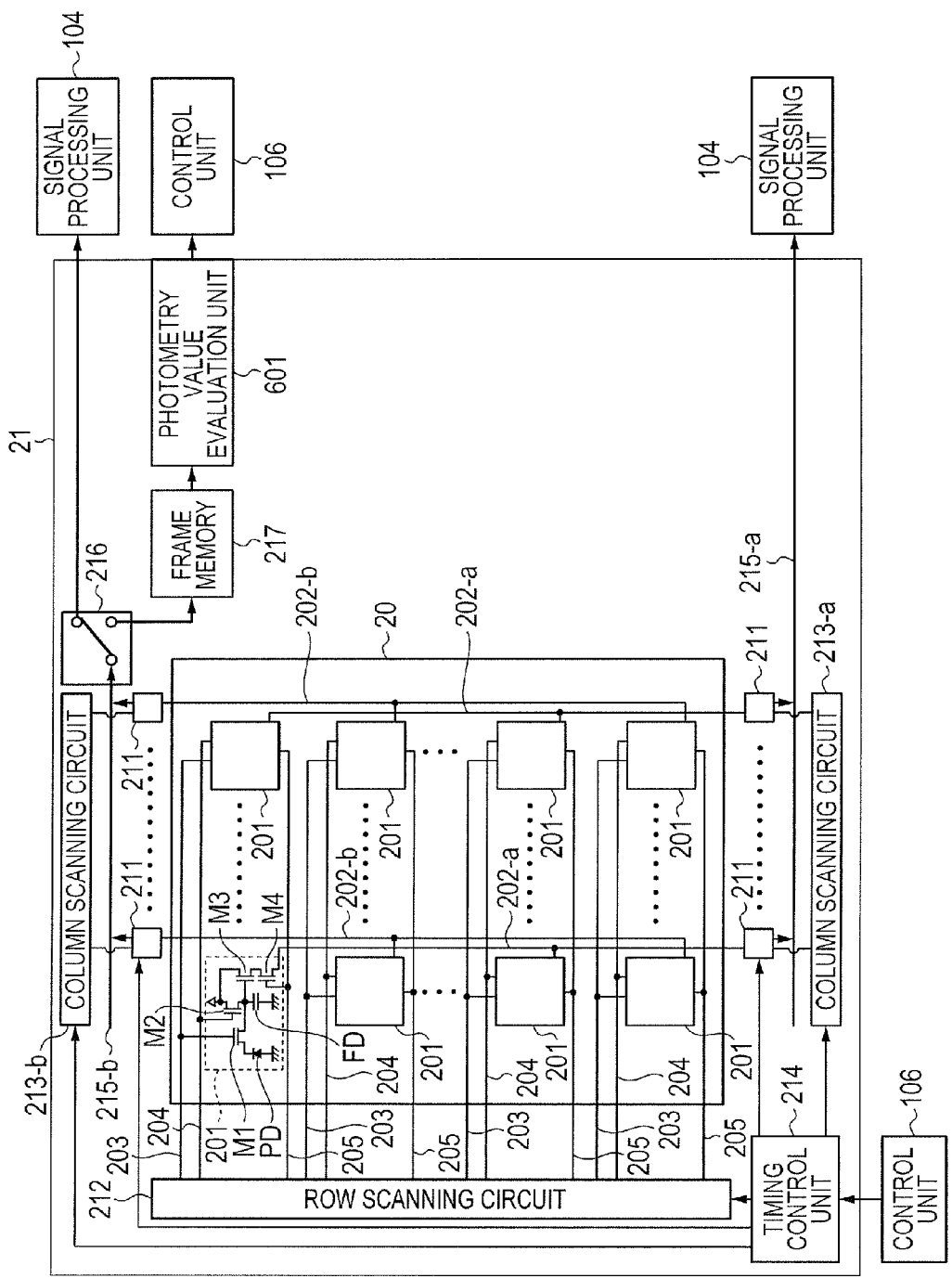
FIG. 6 is a block diagram illustrating the configuration of one example of an image pickup element to be used in a camera according to a second embodiment of the present invention.

FIG. 6 is a block diagram illustrating the configuration of one example of an image pickup element to be used in the camera according to the second embodiment of the present invention.

Note in FIG. 6, component members identical to the image pickup element illustrated in FIG. 2A are designated by identical reference numerals to omit the description thereof.

In the image pickup element 102 illustrated in FIG. 6, the second chip 21 includes a photometry value evaluation unit 601 instead of the AF evaluation value detection unit 1021. The photometry value evaluation unit 601 is connected to the frame memory 217 and to the control unit 106.

The photometry value evaluation unit 601 calculates as a photometry value a color ratio and an exposure value in accordance with the image signal read out from the first chip 20 via the column signal line 202-b and a horizontal signal line 215b (i.e., channel Ch2). In accordance with the photometry value, the photometry evaluation unit 601 outputs to the control unit 106 photometry control data, such as a white balance coefficient and a light emission control amount of the light emission unit 107.

The control unit 106 sends a control instruction to the signal processing unit 104 and the light emission unit 107 in accordance with the photometry control data to control white balance correction in the signal processing unit 104 and the light emission amount in the light emission unit 107.

Figure 7:
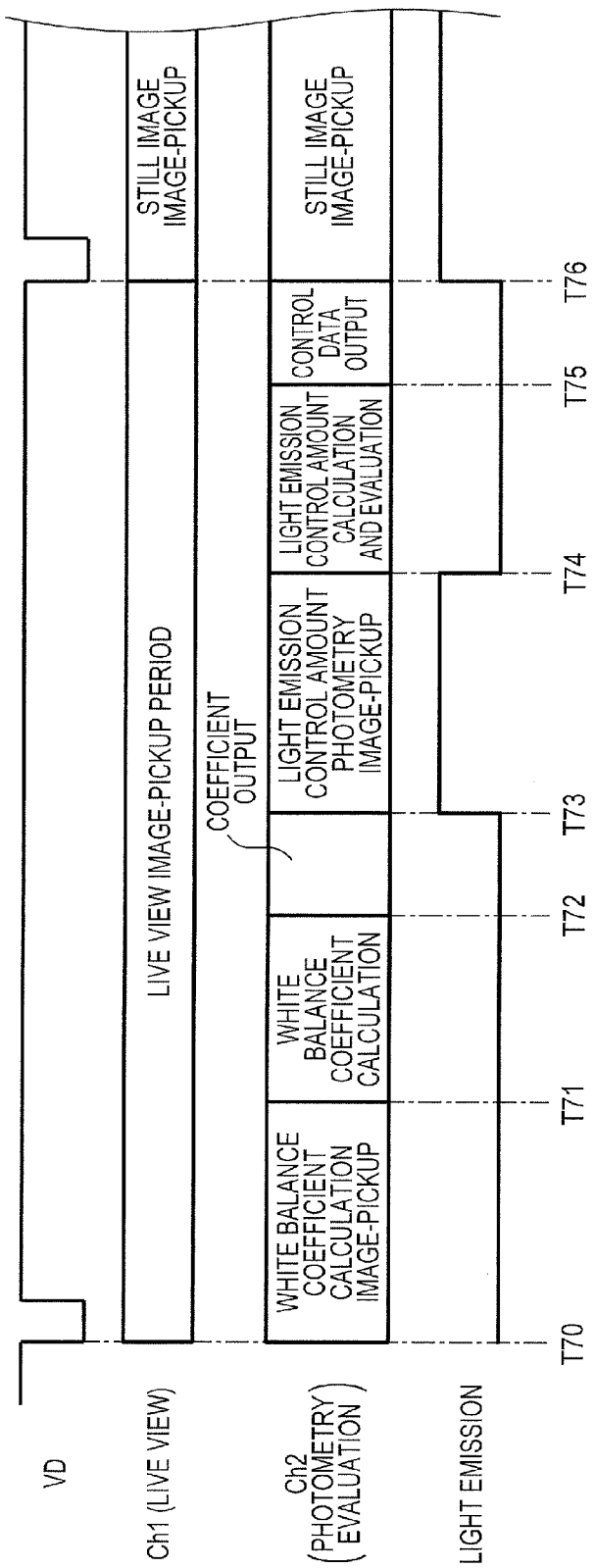
FIG. 7 is a timing chart for describing image-pickup timing in a photometry evaluation mode in the second embodiment of the present invention.

FIG. 7 is a timing chart for describing image-pickup timing in the photometry evaluation mode in the second embodiment of the present invention.

In the photometry evaluation mode, the control unit 106 concurrently starts live view image-pickup with use of the channel Ch1 and photometry evaluation image-pickup with use of the channel Ch2 at the falling edge of the vertical sync signal VD at time T70 in synchronization with the vertical sync signal VD. In the photometry evaluation image-pickup, the photometry evaluation image-pickup for the white balance coefficient and for the light emission control in the light emission unit 107 is performed.

Here, the photometry evaluation image-pickup for white balance coefficient calculation is called white balance coefficient calculation image-pickup, and the photometry evaluation image-pickup for the light emission control is called light emission control amount photometry image-pickup.

First, in a period from T70 to T71, the white balance coefficient calculation image-pickup is performed. An image signal for white balance coefficient evaluation read out from the pixel unit 20 via the channel Ch2 is stored in the frame memory 217 via the horizontal signal line 215-b and the selector switch 216.

In a period from T71 to T72, the photometry value evaluation unit 601 calculates a white balance coefficient in accordance with the image signal for white balance coefficient evaluation stored in the frame memory 217. Then, in a period from T72 to T73, the photometry value evaluation unit 601 outputs the white balance coefficient to the control unit 106.

Next, at time T73, the control unit 106 makes a light emission control signal rise (to H level), and starts the light emission control amount photometry image-pickup, while making the light emission unit 107 emit light with a specified light emission amount. Then, at time T74, the control unit 106 makes the light emission control signal fall (to L level), and terminates the light emission control amount photometry image-pickup.

Consequently, in a period from T73 to T74, the light emission control amount photometry image-pickup for the light emission unit 107 is performed for still image photographing, and the image signal for light emission control amount evaluation is stored in the frame memory 217.

Since the light emission control signal is turned on in the period from T73 to T74, preliminary light emission (i.e., pre-emission) by the light emission unit 107 is performed, so that the light emission control amount photometry image-pickup, which is the image-pickup for calculating the exposure amount of an object, is performed.

In a period from T74 to T75, the photometry value evaluation unit 601 calculates an exposure value relating to an object in accordance with the image signal for light emission control amount evaluation stored in the frame memory 217. In accordance with the exposure value, the photometry value evaluation unit 601 generates a light emission control amount. Next, in a period from T75 to T76, the photometry value evaluation unit 601 outputs the light emission control amount to the light emission control amount control unit 106.

At time T76, the control unit 106 switches the photometry evaluation mode to a still image photographing mode, while turning on the light emission control signal to make the light emission unit 107 emit light (main light emission). At this time, the control unit 106 controls the light emission amount of the light emission unit 107 in accordance with the light emission control amount.

Further, the control unit 106 switches the selector switch 216 to output image signals output via the channel Ch2 to the signal processing unit 104 and provide the image signals read from all the pixels of the pixel unit 20 to the signal processing unit 104.

In the illustrated example, an image for live view of one frame is picked up in the period of one vertical sync signal VD. During this period, white balance coefficient calculation image-pickup, white balance coefficient calculation and output, light emission control amount photometry image-pickup, and light emission control amount calculation and output are performed.

As described in the foregoing, in the second embodiment of the present invention, the AF evaluation value detection unit 1021 is included in the second chip 21, so that while the images for live view are picked up, the photometry evaluation images can be picked up at a high frame rate, and the photometry evaluation values can be calculated and output. As a consequence, a time lag at the time of performing photometry evaluation can be reduced.

Moreover, in photometry evaluation, only the photometry evaluation value small in data volume (white balance coefficient and light emission control amount) is directly sent from the image pickup element 102 to the control unit 106. As a result, a signal output load is reduced and power consumption can be decreased.

In the above-described embodiment, the photometry evaluation value is directly input from the image pickup element 102 into the control unit 106, and the control unit 106 controls the signal processing unit 104 and the light emission unit 107 in accordance with the photometry evaluation value. However, the photometry evaluation value may be sent from the image pickup element 102 to the signal processing unit 104 and the light emission unit 107 to execute direct control.

Third Embodiment

Next, one example of a camera in a third embodiment of the present invention will be described.

The configuration of the camera in the third embodiment is similar to that of the camera illustrated in FIG. 1 except that the configuration of an image pickup element 102 is different from the image pickup element illustrated in FIG. 2B.

Figure 8:
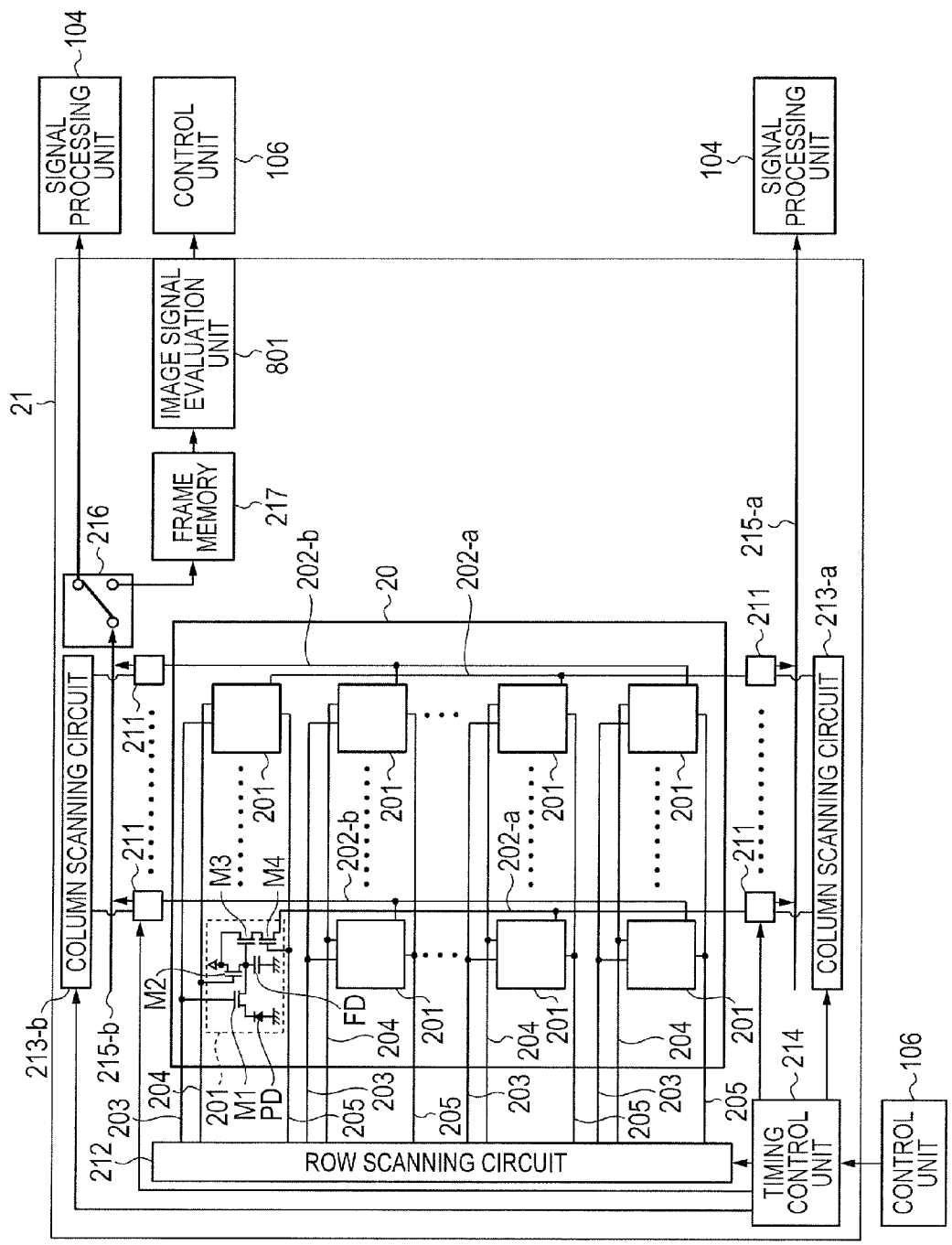
FIG. 8 is a block diagram illustrating the configuration of one example of an image pickup element to be used in a camera according to a third embodiment of the present invention.

FIG. 8 is a block diagram illustrating the configuration of one example of an image pickup element to be used in the camera according to the third embodiment of the present invention.

Note in FIG. 8, component members identical to the image pickup element illustrated in FIGS. 2A and 6 are designated by identical reference numerals to omit the description thereof.

In the image pickup element 102 illustrated in FIG. 8, the second chip 21 includes an image signal evaluation unit 801 instead of the AF evaluation value detection unit 1021. The image signal evaluation unit 801 is connected to the frame memory 217 and to the control unit 106.

The image signal evaluation unit 801 calculates a standard deviation (also referred to as a standard deviation value) that indicates signal variation, in accordance with the image signals read from the first chip 20 via the column signal line 202-b. The image signal evaluation unit 801 then outputs the standard deviation to the control unit 106 as an image signal evaluation value. If the standard deviation exceeds a preset threshold (standard deviation threshold), the control unit 106 sends to the drive unit 103 an image-pickup control signal that keeps a gain-up amount or an exposure amount (i.e., an exposure period) under control. The drive unit 103 drives the image pickup element 102 in accordance with the image-pickup control signal to perform exposure control. This is because the standard deviation, if exceeds the preset threshold, indicates deterioration in an S/N ratio in the image signals, so that limiting the exposure control is effective for maintaining specified image quality.

In the example illustrated in FIG. 8, the exposure control is performed to maintain the specified image quality. However, the specified image quality may be maintained not by the exposure control, but by, for example, switching correction values in noise reduction processing. Further, in the illustrated example, the image signal evaluation unit 801 is configured to output the image signal evaluation value that is a standard deviation. However, the image signal evaluation unit 801 may be configured to output a control signal corresponding to the standard deviation to the drive unit 103, the signal processing unit 104, or the light emission unit 107 so as to maintain specified image quality.

Figure 9:
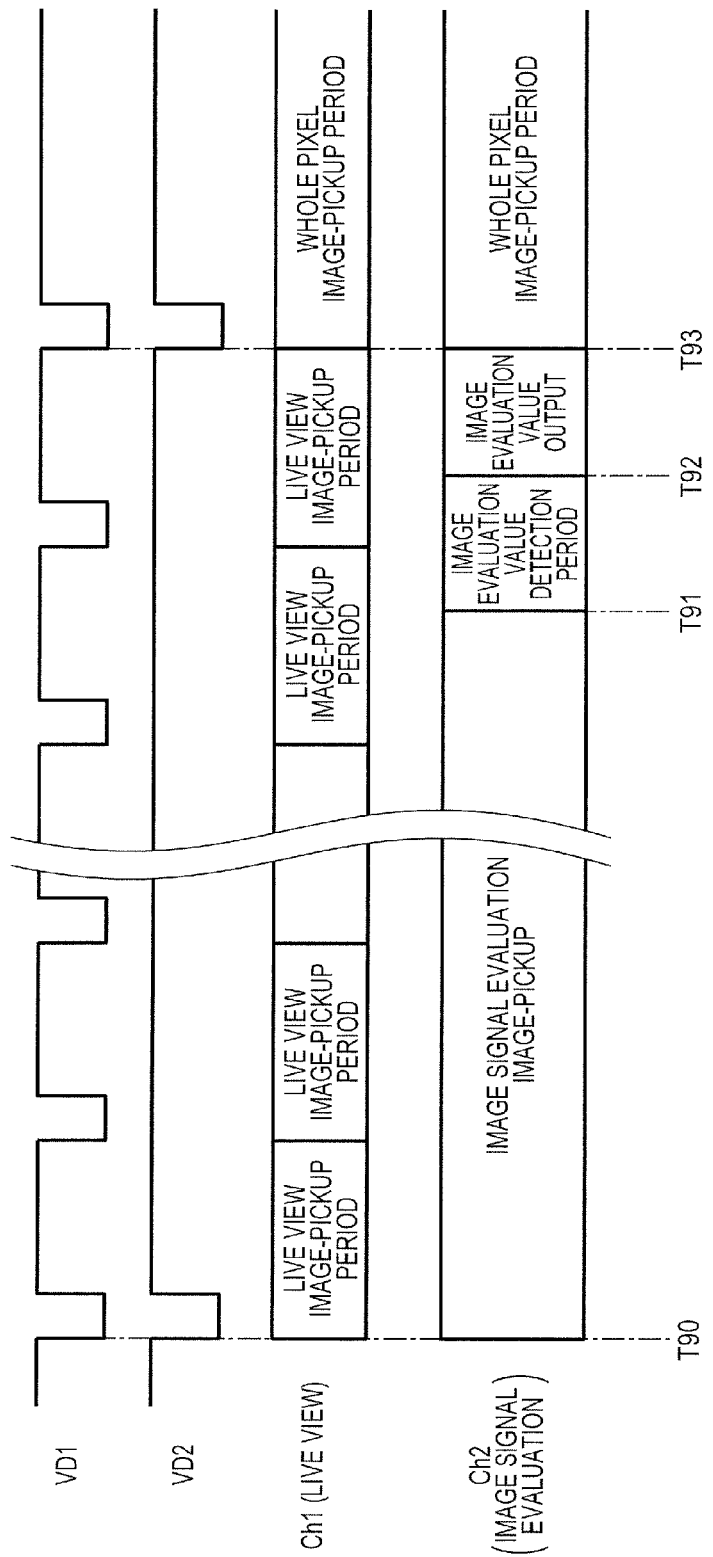
FIG. 9 is a timing chart for describing image-pickup timing in a standard deviation evaluation mode in the third embodiment of the present invention.

FIG. 9 is a timing chart for describing image-pickup timing in the standard deviation evaluation mode in the third embodiment of the present invention.

When the camera is put in the standard deviation evaluation mode, the control unit 106 starts image-pickup at the falling edge of vertical sync signals VD1 and VD2 at time T90. Here, the control unit 106 starts live view image-pickup with use of the channel Ch1 in synchronization with the vertical sync signal VD1, and a standard deviation evaluation image-pickup (also referred to as image signal evaluation image-pickup) with use of the channel Ch2 in synchronization with the vertical sync signal VD2.

In the live view image-pickup in synchronization with the vertical sync signal VD1, image-pickup operation is performed in accordance with the frame rate for live-view display. In a 1VD period (T90 to T93) relating to the vertical sync signal VD2, live view image-pickup of multiple frames is performed.

In the image signal evaluation image-pickup in a period from T90 to T91, standard deviation detection image signals read out to the channel Ch2 are read from the image pickup element 102. The setting in the period from T90 to T91 is identical to the setting in the exposure period for the still image image-pickup after the time T93. The exposure control after the time T93 is determined in accordance with AE control corresponding to the image signal obtained from user operation with use of the operation unit 108 or from the image pickup element 102. Therefore, in the image signal evaluation image-pickup in the channel Ch2, exposure control different from the exposure control for live-view display in the channel Ch1 is performed.

Further, deterioration in S/N due to signal amplification, which causes deterioration in image quality before still image photographing, can be limited by performing exposure control same as the control in the still image photographing after the time T93 in the channel Ch2. Furthermore, image-pickup control such as long accumulation operation of the image-pickup pixels can be limited. As a result, the image quality of the still image can be prevented from deteriorating beyond a specified level.

The output of the channel Ch2 obtained as a result of image-pickup in the period from T90 to T91, i.e., the standard deviation detection image signals, is stored in the frame memory 217 via the horizontal signal line 215-*b* and the switch 216. The standard deviation detection image signals stored in the frame memory 217 in the period from T91 to T92 are read into the image signal evaluation unit 801, and the image signal evaluation unit 801 calculates a standard deviation value which is signal variation in the standard deviation detection image signals.

Then, in a period from T92 to T93, the image signal evaluation unit 801 outputs from the image pickup element 102 only the standard deviation value calculated in the period from T91 to T92 to the control unit 106. After the time T93, the camera is switched from the standard deviation evaluation mode to the still image photographing mode. The control unit 106 switches the switch 216 to enable image signals to be output to the signal processing unit 104 so that all the pixels can be read out. In this case, the control unit 106 performs exposure control in accordance with the standard deviation value calculated in the image signal evaluation unit 801.

As described in the foregoing, the third embodiment of the present invention is configured to perform image-pickup of the image signal for live view and the image signal for evaluation at the same time. Accordingly, before still image image-pickup is performed, a standard deviation value for controlling the operation in the still image image-pickup can be detected prior to actual photographing.

Further, the third embodiment is configured to directly output to the control unit 106 a standard deviation value that is an image signal evaluation value small in data amount. Accordingly, it is no longer necessary to send the image signal large in data amount from the image pickup element 102 to the signal processing unit 104. As a result, load reduction resulting from signal output enables power reduction.

Thus, in the third embodiment of the present invention, the image signals are concurrently obtained in the image pickup element 102 in the image-pickup period different from the live view image-pickup period, through the image-pickup operation different from live view image-pickup operation. In accordance with the obtained image signals, a standard deviation value that is an image signal evaluation value is calculated in the image pickup element 102 and is output to the control unit 106. As a consequence, the image signal evaluation value can be obtained during the live view mode, so that time reduction can be achieved together with power saving.

According to the third embodiment, the standard deviation value relating to the image signals is described to be calculated, evaluation values as shown below may be calculated in the image signal evaluation unit 801, and corresponding correction may be performed in the control unit 106.

(1) An image signal offset correction value that is the amount of variation in offset component per frame, to be used as an image signal reference value, may be calculated from image signals. (2) A noise of a stripe-shaped fixed pattern may be detected on a column or a row basis. (3) A flicker may be detected by setting an exposure condition different from the conditions for moving image recording or live-view display and by detecting change in light source output. A hand shake correction value or a motion detection value of an object may be calculated by detecting (4) a WB coefficient, (5) a moving amount of a target object and (6) a vector quantity. (7) A chrominance shading evaluation value, (8) a luminance shading evaluation value, and (9) a flicker evaluation value may be calculated, so as to perform exposure control through shutter control of an iris mechanic unit in the mechanical optical unit 1011 or the image pickup element 102.

It should naturally be understood that the above-stated evaluation values may be obtained and corrected not only by the methods disclosed but also by other publicly known methods.

As is clear from the aforementioned description, in the example illustrated in FIG. 1, the control unit 106 and the drive unit 103 function as a control unit and a readout control unit. The control unit 106 and the image display unit 109 also function as a display control unit.

Although the present invention has been described based on the embodiments, it should be understood that the present invention is not limited to these specific embodiments, and various forms which come within the scope and the spirit of the present invention are intended to be embraced therein.

For example, the functions in the above-described embodiments may be used as a control method, and the control method may be executed by the image pickup apparatus. Further, a program having the functions of the aforementioned embodiments may be used as a control program, and the program may be executed by a computer included in the image pickup apparatus. For example, the control program may be recorded on a computer readable recording medium.

Each of the above-described control method and control program includes at least a control step and a display control step.

The present invention can also be realized by executing the following described processing. That is, software (program) that implements the functions of the aforementioned embodiments is supplied to a system or an apparatus via a network or various kinds of recording media. A computer (or a device such as a CPU and an MPU) of the system or the apparatus reads out and executes the program.

According to the present invention, control information to be used exclusively for control, such as focus control, is output from the image pickup element at the time of executing the control. As a result, data transfer time can be reduced and, in addition, deterioration in image quality can be avoided.

Fourth Embodiment

FIG. 11 is a block diagram illustrating a configuration example of an image pickup apparatus according to a fourth embodiment of the present invention. For example, the illustrated image pickup apparatus is applied to a digital still camera with a moving image function or a video camera.

In FIG. 11, an image pickup apparatus 1100 includes a lens 1101, an image sensor 1102, an image signal processing unit 1103, a compression expansion unit 1104, a lens drive control unit 1105, an image-pickup signal evaluation value detection unit 1106, a scene determination unit 1107, and a system control unit 1108. The image pickup apparatus 1100 further includes a light emission unit 1109, an operation unit 1110, a storage unit 1111, and a display unit 1112.

The lens 1101 is a lens group forming a photographing optical system. A focus lens is included in the lens 1101. The focus lens is a focus adjustment lens. The focus lens is adapted so that the position thereof can be changed along an optical axis direction. The lens drive control unit 1105 has a function as a focus adjustment unit to perform drive control of the focus lens based on a value detected by the image-pickup evaluation value detection unit 1106 and to perform focus adjustment processing. Light which passes through the lens 1101 is focused, as an optical image of an object, on an imaging plane of the image sensor 1102 that is formed of a CMOS image sensor or the like. The optical image is then photoelectrically converted into a pixel signal in later-described pixels 1201.

The image sensor 1102 has pixels 1201 and an A/D converter. For example, the image sensor 1102 is a so-called XY read-type CMOS image sensor. Under the control of the system control unit 1108, the image sensor 1102 performs image-pickup operation, such as exposure, signal readout and reset, and outputs an image-pickup signal (also referred to as an image signal).

The image-pickup evaluation value detection unit 1106 detects an image-pickup evaluation value from the image signal outputted from the image sensor 1102. In this case, the image-pickup evaluation value is detected with the timing output from the system control unit 1108. The detailed operation thereof will be described later.

Here, the image-pickup evaluation value refers to a parameter necessary for performing control of the image pickup apparatus, correction of photographed images, and the like. For example, the image-pickup evaluation value is an evaluation value necessary for basic operation of the image pickup apparatus, such as an AF evaluation value, a white balance (WB) evaluation value, and an automatic exposure (AE) evaluation value. The AF evaluation value is an evaluation value for focusing an object at the time of image-pickup, which is necessary mainly for controlling the focus lens. The WB evaluation value is an evaluation value necessary for correcting chrominance at the time of image-pickup and is also a parameter necessary at the time of developing. The AE evaluation value is an evaluation value necessary for obtaining proper exposure at the time of photographing. The AE evaluation value is necessary mainly for setting a diaphragm, a shutter speed and a sensibility.

The system control unit 1108 determines a control amount of the lens 1101 based on the AF evaluation value which is one of the parameters obtained as the image-pickup evaluation value, and outputs the control amount to the lens drive control unit 1105. The lens drive control unit 1105 performs focus adjustment of an object by driving the lens 1101 in the optical axis direction based on the control amount of the AF evaluation value obtained from the system control unit 1108.

Under the control of the system control unit 1108, the image signal processing unit 1103 performs signal processing of an image signal, which is the output of the image sensor 1102, to generate image data. More specifically, based on the image-pickup evaluation value detected in the image-pickup evaluation value detection unit, signal processing, such as white balance adjustment processing, color correction processing, and AE processing, is performed, to generate the image data.

The compression expansion unit 1104 operates under the control of the system control unit 1108, and performs a compression coding process in a specified still image data format on the image data which is the output of the image signal processing unit 1103. For example, the specified still image data format is a JPEG (Joint Photographic Coding Experts Group) method. The compression expansion unit 1104 also performs an expansion decoding process on the coded image data sent from the system control unit 1108. The compression expansion unit 1104 may also perform compression coding/expansion decoding processes on the moving image data by using a MPEG (Moving Picture Experts Group) method and the like.

In the scene determination unit 1107, a photographing scene is determined based on a photographing condition obtained from the system control unit. In accordance with the determined photographing scene, information for changing the parameters, such as a photographing parameter for photographing and an image processing parameter, is sent to the system control unit 1108. Here, the image-pickup evaluation value detection unit 1106 determines which signal to use to detect an image-pickup evaluation value, an image signal for image-pickup evaluation value detection or an image signal for display as described later, based on the information on scene determination.

The system control unit 1108 is a microcontroller including, for example, a central processing unit (CPU), a read only memory (ROM) and a random access memory (RAM). The CPU of the system control unit 1108 executes a program stored in the ROM, so that the entire image pickup apparatus 1100 is comprehensively controlled.

When it is determined that an exposure value of an object is low in the AE processing performed by the image signal processing unit 1103, the light emission unit 1109 emits light to illuminate the object. For example, a strobe apparatus using a xenon tube or an LED light emitting device may be used as the light emission unit 1109. For example, the operation unit 110 has various operation keys, levers and dials, such as a shutter release button, to give a manipulate signal corresponding to user input operation to the system control unit 1108.

The recording unit 1111 is, for example, a recording medium such as a portable semiconductor memory, an optical disk, a hard disk drive (HDD) or a magnetic tape to store image data, which is compression-coded by the compression expansion unit 1104, as an image file. The recording unit 1111 also reads out an image file specified by the system control unit 1108, and outputs it to the system control unit 1108.

The image display unit 1112 includes, for example, a display device, such as a liquid crystal display (LCD) and an interface circuit for the LCD, to display on the display device an image indicated by the image data sent from the system control unit 1108.

Figure 12A:
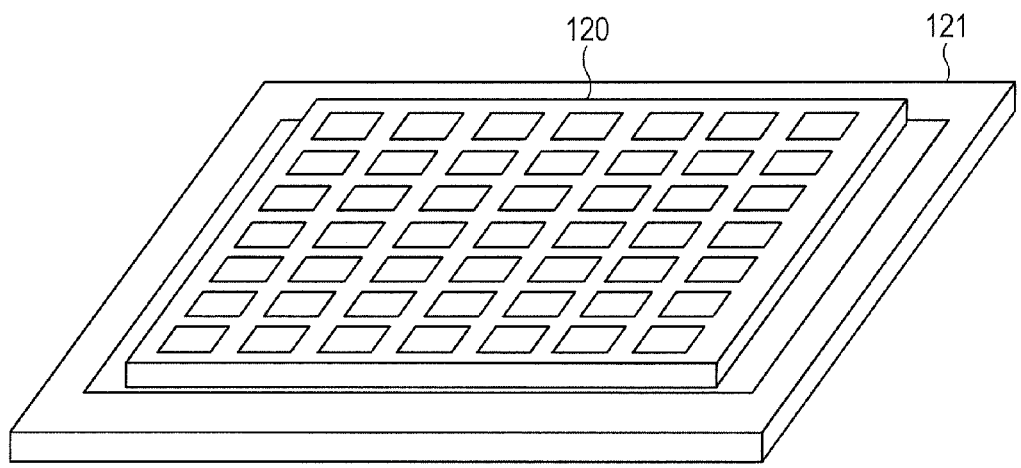

FIGS. 12A and 12B are explanatory views for illustrating the configuration of the image sensor 1102 illustrated in FIG. 11. FIG. 12A is a perspective view of the image sensor, and FIG. 12B is a block diagram illustrating the configuration thereof.

In FIG. 12A, the image sensor 1102 has a first chip (first element unit) 120 and a second chip 121 (second element unit), with the first chip 120 being layered on top of the second chip 121. The first chip 120, which has a plurality of pixels 1201 arrayed in a matrix form, is layered so that a pixel array faces the light incidence side (i.e., positioned on the side of receiving the optical image). The second chip 121 has a pixel drive unit, including later-described column scanning circuits 1213-a and 1213-b and a row scanning circuit 1212, formed thereon.

If the pixels 1201 are formed on the first chip 120 and the pixel drive unit is formed on the second chip 121 in this way, manufacturing process of the peripheral circuits and the pixel unit of the image sensor 1102 can be separated. As a result, the tendency to narrowing wire width and highly-increasing wire density in the peripheral circuits can realize speed improvement, downsizing, and higher performance.

As illustrated in FIG. 12B, the pixels 1201 are arrayed in a matrix form on the first chip 120, and each of the pixels 1201 is connected to a transfer signal line 1203, a reset signal line 1204, and a row selection signal line 1205 in the horizontal direction (row direction). The pixels 1201 are also connected to column signal lines 1202-a and 1202-b in the vertical direction (column direction). Note that the column signal lines 1202-a and 1202-b are each configured to connect the pixels to different read destinations on a row basis.

As illustrated, each of the pixels 1201 also has a photo diode PD that is a photoelectric conversion element, a transfer transistor M1, a reset transistor M2, an amplification transistor M3, a selecting transistor M4, and a floating diffusion FD. In the illustrated example, each of the transistors is an n channel MOS field-effect transistor (MOS FET).

Gates of the transfer transistor M1, the reset transistor M2, and the selecting transistor M4 are connected to the transfer signal line 1203, the reset signal line 1204 and the row selection signal line 1205, respectively. These signal lines 1203 to 1205 are arranged extendedly in the horizontal direction, and the pixels in the same row are simultaneously driven. As a consequence, operation of a rolling shutter of line sequential operation type or a global shutter of whole line simultaneous operation type can be controlled. Further, a source of the selecting transistor M4 is connected to the column signal line 1202-a or 1202-b on a row basis.

The photo diode PD accumulates charge generated by photoelectric conversion. The P side of the photo diode PD is grounded while the N side is connected to a source of the transfer transistor M1. When the transfer transistor M1 is turned on, the charge of the photo diode PD is transferred to the FD. Since a parasitic capacitance exists in the FD, the charge transferred to the FD is accumulated.

A supply voltage Vdd is applied to a drain of the amplification transistor M3, while a gate of the amplification transistor M3 is connected to the FD. The amplification transistor M3 amplifies the charge (i.e., voltage) of the FD and converts it into a voltage signal. The selecting transistor M4 is to select, with the row selection signal line 1205, the pixels for reading out signals on a row basis. A drain of the selecting transistor M4 is connected to a source of the amplification transistor M3. A source of the selecting transistor M4 is connected to the column signal line 1202.

When the selecting transistor M4 is turned on by the row selection signal line 1205, a voltage signal corresponding to the voltage of the FD is output to the column signal line 1202. The supply voltage Vdd is applied to a drain of the reset transistor M2, while a source of the reset transistor M2 is connected to the FD. When the reset transistor M2 is turned on by the reset signal line 1204, the voltage of the FD is reset to the supply voltage Vdd.

The second chip 121 includes a column ADC block 1211 provided thereon, and the column ADC block 1211 is connected to the column signal line 1202-a or 1202-b. Further, the second chip 121 includes a row scanning circuit 1212, column scanning circuits 1213-a and 1213-b, a timing control unit 1214, and horizontal signal lines (output units) 1215-a and 1215-b provided thereon.

The timing control unit 1214 controls operation timing of the row scanning circuit 1212, the column scanning circuits 1213-a and 1213-b, and the column ADC block 1211 under the control of the system control unit 1108. The row scanning circuit 1212 scans each row, while the column scanning circuits 1213-a and 1213-b scan each column, respectively.

The horizontal signal lines 1215-a and 1215-b transfer output signals (image signals) of the column ADC block 1211 based on the timing controlled in each of the column scanning circuits 1213-a and 1213-b. As a consequence, an image signal for live view (a second image signal or an image display signal) is output to the column signal line 1202-a, and an image signal for image-pickup evaluation detection (a first image signal) is output to the column signal line 1202-b.

In FIG. 13, rows with row numbers 1 and 2 (first pixel group) are used for image-pickup of an image for image-pickup evaluation value detection, while rows with the row numbers 3 to 8 (second pixel group) are used for image-pickup of an image for live view. In the illustrated example, read-scanning is performed in sequence on a row basis, and every eight rows are repeatedly scanned to be read.

In the image-pickup for image-pickup evaluation value detection, thinning-out read of 3 out of 4 vertical same-color pixels is carried out as significance is placed on the frame rate. Meanwhile, in the image for live view, 1 out of 4 vertical same-color pixels is thinned out and 3 pixels are added as significance is placed on image quality. In other words, in the image-pickup for image-pickup evaluation value detection, the first pixel group is read out at a first frame rate. In the live view image-pickup, the second pixel group is read out at a second frame rate that is slower than the first frame rate.

As described in the foregoing, the image-pickup for image-pickup evaluation value detection and the image-pickup for live view are separated on a selected row basis, so that image signals can be obtained in different charge storage time at the frame rates different in data size.

A voltage signal (analog signal) output to the column signal lines 1202-a and 1202-b is converted from the analog signal into a digital signal (image signal) in the column ADC block 1211 illustrated in FIGS. 12A and 12B. The image signal which is the output of the column ADC block 1211 is read and output from the column ADC block 1211 to the horizontal signal line 1215-a or 1215-b by the column scanning circuit 1213-a or 1213-b (the first readout unit, the second readout unit).

Next, operation to detect an optimum image-pickup evaluation value for AF operation (AF evaluation value) as an example of the image-pickup evaluation value will be described with reference to FIGS. 14A and 14B.

FIG. 14A is a timing chart for detecting an AF evaluation value (auto-focus evaluation value) from an image for image-pickup evaluation value detection as a result of later-described scene determination. As illustrated in FIG. 14A, image-pickup timing is stipulated by a vertical sync signal. When the camera is put in the AF evaluation mode, the system control unit 1108 makes an AF control signal rise (to H level) at the falling edge of the vertical sync signal at time T0. Next, once the vertical sync signal has risen, the system control unit 1108 starts and performs image-pickup operation for both an image display signal and an image-pickup evaluation value detection signal at the same time in synchronization with the vertical sync signal.

In a period from T0 to TF1, the image signal for image-pickup evaluation read from the pixel unit 120 via the horizontal signal line 1215-*b* is input into the image-pickup evaluation value detection unit 1106. Then, in a period from TF1 to TF2, an AF evaluation value is calculated. The AF evaluation value is calculated according to the timing controlled by the system control unit 1108 based on contrast information and phase-difference information obtained from the image signal for image-pickup evaluation value detection which is output from the image sensor 1102. Then, in a period from TF2 to TF3, the image-pickup evaluation value detection unit 1106 outputs the AF evaluation value to the system control unit 1108.

In the illustrated example, during a period of one vertical sync signal, an image for live view of one frame is picked up, while AF evaluation value detection images (AF scanning) of three frames are picked up. When the system control unit 1108 puts the vertical sync signal at L level, AF evaluation during the period of the image for live view of one frame is completed.

The system control unit 1108 compares the AF evaluation value with a later-described specified AF expected value. If the AF evaluation value satisfies a specified evaluation condition with respect to the AF expected value, the system control unit 1108 makes the AF control signal fall (time T1). Once the AF control signal has fallen, only the AF evaluation image-pickup is terminated and live view image-pickup is continued.

FIG. 14B is a timing chart for detecting an AF evaluation value from the image for live view in accordance with the result of later-described scene determination.

As illustrated in FIG. 14A, image-pickup timing is stipulated by the vertical sync signal. When the AF evaluation mode is set, the system control unit 1108 makes the AF control signal rise (to H level) at the falling edge of the vertical sync signal at time T0. Next, once the vertical sync signal has risen, the system control unit 1108 performs image-pickup operation for only the signal for image display in synchronization with the vertical sync signal.

In a period from T0 to TF4, the image signal for live view read from the pixel 1201 via 1215-*a* is input into the image-pickup evaluation value detection unit 1106 and the image signal processing unit 1103. In a period from TF4 to TF5, an AF evaluation value is calculated. The image-pickup evaluation value detection unit 1106 calculates the AF evaluation value according to the timing controlled by the system control unit 1108 based on contrast information and phase-difference information obtained from the image signal for live view image which is output from the image sensor 1102. Then, in a period from TF5 to TF6, the image-pickup evaluation value detection unit 1106 outputs the AF evaluation value to the system control unit 1108.

In the illustrated example, during one vertical sync signal, an image for live view of one frame is picked up and an image for AF evaluation value detection (AF scanning) is not picked up. When the system control unit 1108 puts the vertical sync signal at L level, AF evaluation during the period of one frame of the image for live view is completed.

The system control unit 1108 compares the AF evaluation value detected from the image for live view with a later-described specified AF expected value. If the AF evaluation value satisfies a specified evaluation condition with respect to the AF expected value, the AF control signal is made to fall (time T7). Once the AF control signal has fallen, AF evaluation detection operation based on the display image is terminated, and live view image-pickup is continued.

As illustrated in FIG. 14A, in the present embodiment, a frame rate faster than live view image operation can be set for the image for image-pickup evaluation value detection. Accordingly, reflection of the image-pickup evaluation value on the image pickup apparatus can be controlled more quickly than before.

However, the image pickup apparatus has a limit of tracing in dark scene due to exposure control set by a program diagram. Accordingly, the image for image-pickup evaluation value detection with a high frame rate and the image for live view with a low frame rate are different in the limit of tracing in dark scene due to exposure control. In the present embodiment, difference of three states is generated in the limit of tracing in dark scene.

The scene determination unit 1107 determines features of a photographing scene from an exposure amount calculated from a sensibility set value, a shutter speed and the like, which are set as photographing (exposure) conditions by the system control unit 1108, at the time of photographing an image for live view. The image-pickup evaluation value detection unit 1106 detects an image-pickup evaluation value from any one of the image for image-pickup evaluation value detection and the image for live view in accordance with the result of determination by the scene determination unit 1107.

Figure 15:
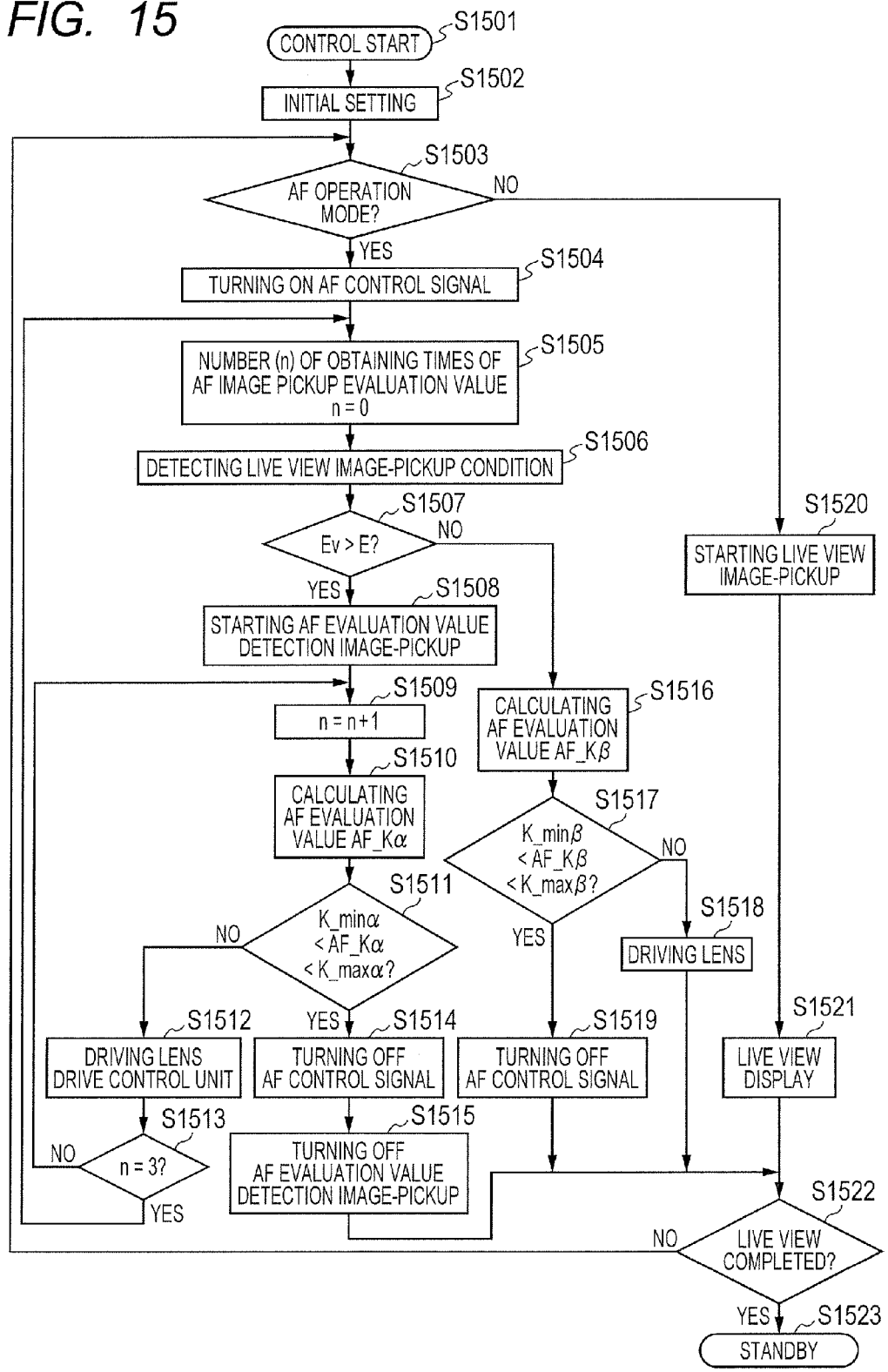
FIG. 15 is a flow chart illustrating operation in the AF mode in the image pickup apparatus according to the fourth embodiment of the present invention.

Operation of the image pickup apparatus according to the fourth embodiment in the AF evaluation mode will be described in detail below with reference to the flow chart of FIG. 15.

Note that the illustrated flow chart is performed under the control of the system control unit 1108. For description, an image-pickup evaluation value detected in the image for image-pickup evaluation value detection is defined as AF_Kα, and an image-pickup evaluation value detected in the image for live view is defined as AF_Kβ.

After power is turned on and various initial settings are set by a user (step S1502), the mode of the camera is shifted to an operation mode, such as a live view mode and a moving image recording, and photographing is started (step S1520).

The system control unit 1108 determines whether or not the AF evaluation mode is in effect (step S1502). In short, the system control unit 1108 determines whether or not the auto-focus mode is set. If the AF evaluation mode is not in effect (NO in step S1503), the system control unit 1108 starts only the live view image-pickup (step S1520), and proceeds to step S1521 described later.

If the AF evaluation mode is determined to be in effect (YES in step S1503), the system control unit 1108 turns on the AF control signal (H level) (step S1504). Next, the system control unit 1108 substitutes 0 into variable n to count the number of times of AF evaluation image-pickup (step S1505). Next, in step S1506, the system control unit 1108 detects an exposure amount S of the image-pickup condition for performing live view photographing.

Next, the scene determination unit 1107 compares the exposure amount E detected in step S1506 with an exposure amount expected value Ev (image-pickup condition determination). The system control unit 1108 determines whether or not the exposure amount in live view photographing satisfies Formula (1) with respect to the expected value Ev in the exposure setting, i.e., whether or not a specified sensibility condition is satisfied (step S1507).

$$E<Ev \quad (1)$$

If the live view exposure amount Ev satisfies Formula (1) (Yes), the operation proceeds to S1508 to start AF evaluation value detection image-pickup.

Next, as described in FIG. 14A, the system control unit 1108 starts AF evaluation image-pickup (Step S1508). After the AF evaluation image-pickup is started, the system control unit 1108 increments the variable n by 1 (step S1509). Then, under the control of the system control unit 1108, the image-pickup evaluation value detection unit 1106 detects an AF evaluation value AF_Kα from the image signal for AF evaluation obtained in AF evaluation image-pickup (step S1510).

Next, the system control unit 1108 determines whether or not the AF evaluation value AF_Kα satisfies Formula (2) with respect to AF expected values K_minα and K_maxα, i.e., whether or not the AF evaluation value AF_Kα satisfies the specified evaluation condition (step S1511).

$$K\_min\alpha < AF\_K\alpha < K\_max\alpha \quad (2)$$

where AF evaluation value expected values K_minα and K_maxα are set as expected minimum value and maximum value of the AF evaluation value. These values are pre-recorded on the system control unit 1108 in a design phase or in an adjustment phase of the image pickup apparatus.

If the AF evaluation value AF_Kα does not satisfy Formula (2) (NO in step S1511), the system control unit 1108 calculates a feedback control amount based on the above-described AF evaluation value AF_Kα. The system control unit 1108 then carries out drive control of the lens drive control unit 1105 in accordance with the feedback control amount to drive the focus lens included in the lens 1101 (step S1512).

Next, the system control unit 1108 determines whether or not variable (the number of times of AF evaluation value image-pickup) n is a specified number (3 in this case) (step S1513). If the number of times of AF evaluation value image-pickup is less than 3 (NO in step S1511), the system control unit 1108 returns to the processing of step S1510, and performs AF evaluation image-pickup. Contrary to this, if the number of times of AF evaluation value image-pickup is 3 (Yes in step S1513), the system control unit 1108 returns to the processing of step S1505, and sets the number of times n of AF evaluation value image-pickup to zero.

If the AF evaluation value AF_Kα satisfies Formula (2) (YES in step S1511), the system control unit 1108 turns off the AF control signal (L level) (step S1514), and terminates AF evaluation image-pickup in the image pickup element 1102 (step S1515). Then, the system control unit 1108 makes the operation proceed to step S1522.

If the exposure amount E of the image for live view does not satisfy Formula (1) in step S1507 (No), the operation proceeds to S1516, and an AF evaluation value AF_Kβ is detected from the picked up image for live view. Next, the system control unit 1108 determines whether or not the AF evaluation value AF_Kβ satisfies Formula (3) with respect to AF expected values K_minβ and K_maxβ, i.e., whether or not the AF evaluation value AF_Kβ satisfies the specified evaluation condition (step S1517).

$$K\_min\beta < AF\_K < K\_max\beta \quad (3)$$

where AF expected values K_minβ and K_maxβ are set as an expected minimum value and maximum value of the AF evaluation value. These values are pre-recorded on the system control unit 1108 in a design phase or in an adjustment phase of the image pickup apparatus.

If the AF evaluation value AF_Kβ does not satisfy Formula (3) (NO in step S1517), the system control unit 1108 calculates a feedback control amount in accordance with the above-described AF evaluation value AF_Kβ. The system control unit 1108 then carries out drive control of the lens drive control unit 1105 in accordance with the feedback control amount to drive the focus lens included in the lens 1101 (step S1518), and the operation proceeds to step S1522.

If the AF evaluation value AF_Kβ satisfies Formula (3) (Yes in step S1517), the system control unit 1108 turns off the AF control signal (L level) (step S1519), and the operation proceeds to step S1522. In step S1522, if there is a live view operation completion instruction (Yes), the live view operation is completed. If the live view moving image is continued (No), the operation returns to step S1503, and AF operation is performed while the live view operation is performed.

As described in the foregoing, the present embodiment is premised on the image pickup apparatus that includes an image pickup element capable of performing the image-pickup for live view and the image-pickup for image-pickup evaluation value detection at the same time during one frame period. In accordance with the result of scene determination based on the exposure condition at the time of live view image-pickup, an image for detecting the AF evaluation value is selected from the image for AF evaluation value and the image for live view. As a consequence, when an object is photographed in a light scene, a time lag in performing AF evaluation can be reduced, while in a dark scene, the precision in AF evaluation value can be enhanced. Moreover, in the present embodiment, different AF expected values to be used in comparison with the AF evaluation values are prepared for the image for AF evaluation value and the image for live view. However, these expected values may be identical.

In the present embodiment, although the AF evaluation value is described as an example of the image-pickup evaluation value, other image-pickup evaluation values, such as a WB evaluation value (white balance data) and an AE evaluation value (exposure control data), may also be detected as an optimum evaluation value in the similar configuration. In the case of the WB evaluation value or the AE evaluation value, the image for image-pickup evaluation value detection and the image for live view are switched to detect the evaluation value in accordance with the result of scene determination of step S1507. As a result, the time lag can be reduced and the precision in the WB or AE evaluation value detection can be optimized.

Fifth Embodiment

The fourth embodiment of the present invention has described a construction configured to determine a photographing scene based on only the exposure information and to detect, in accordance with the result of determination, an AF evaluation value from one of the image for AF evaluation value and the image for live view. The present embodiment is configured to determine a photographing scene based on not only the exposure information but also the face information, the luminance information and the chrominance information to detect an image-pickup evaluation value with still more sufficient precision. An image pickup apparatus according to the fifth embodiment of the present invention will be described below with reference to FIGS. 16 through 18. Note that illustrated component members identical to those in the fourth embodiment are designated by identical reference numerals to omit the description thereof.

Figure 16:
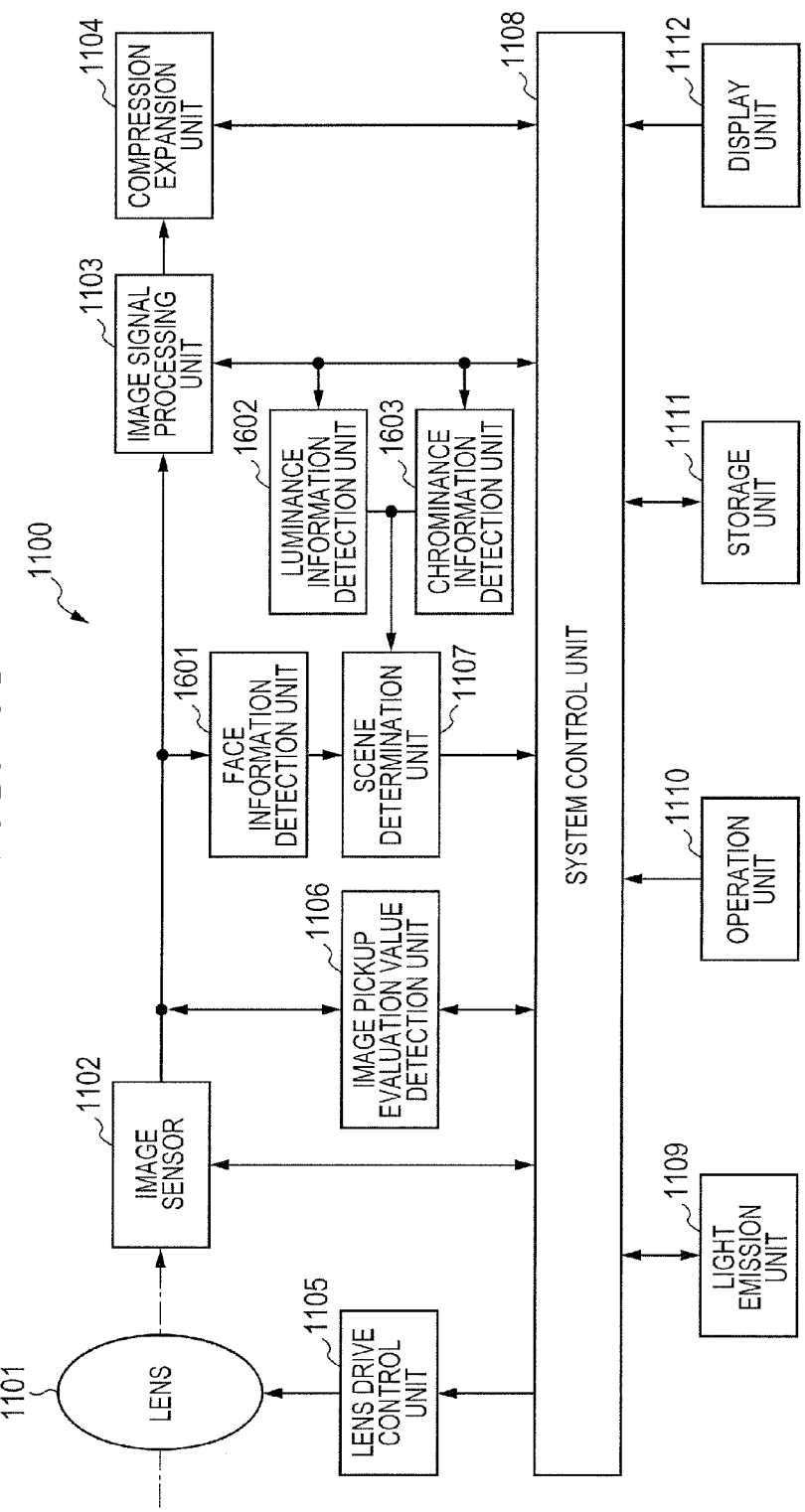
FIG. 16 illustrates the configuration of an image pickup apparatus according to a fifth embodiment of the present invention.

FIG. 16 is a block diagram of the image pickup apparatus according to the present embodiment. The present embodiment is similar in configuration to the fourth embodiment except that a face information detection unit 1601, a luminance information detection unit 1602, and a chrominance information detection unit 1603 are provided.

The face information detection unit 1601 performs face detection processing on an image signal output from the image sensor 1102 to detect the face of a person or an animal (e.g., a pet) in a photographed frame image. The face information detection unit 1601 also outputs to the scene determination unit 1107 a detected face region as face information.

The luminance information detection unit 1602 performs luminance detection processing on the image data image output from the image signal processing unit 1103. In the processing, an image frame image is divided into a plurality of regions, and an average luminance of each region is obtained. The luminance information detection unit 1602 calculates, by using these average luminances, luminance information such as a luminance difference between a central portion and a peripheral portion of the frame image and a central luminance value. The luminance information detected in the luminance information detection unit 1602 is output to the scene determination unit 1107.

The chrominance information detection unit 1603 performs chrominance detection processing on the image data image output from the image signal processing unit 1103 to detect chrominance information, such as an average chroma and the area of a high chroma region. The chrominance information detected in the chrominance information detection unit 1603 is output to the scene determination unit 1107.

The scene determination unit 1107 determines a background and an object in the photographing scene from the image data image processed in the signal processing unit 1103 based on each information input from the face information detection unit 1601, the luminance information detection unit 1602, and the chrominance information detection unit 1603. Note that each of the information sent from the face information detection unit 1601, the luminance information detection unit 1602, and the chrominance information detection unit 1603 is temporarily stored by the scene determination unit 1107 and is updated as required.

Next, operation to determine the photographing scene in the image pickup apparatus according to the present embodiment will be described.

The scene determination unit 1107 determines the background of the photographing scene in an image signal for live view output from the image sensor 1102 by using the luminance information detected in the luminance detection unit 1602 and the chrominance information detected in the chrominance information detection unit 1603. The scene determination unit 1107 further determines an object in the photographing scene by using the face information detected in the face detection unit 1601.

First, determination of the background of the photographing scene will be described first.

The scene determination unit 1107 analyzes the luminance information detected in the luminance detection unit 1602 and the chrominance information detected in the chrominance information detection unit 1603, and determines whether or not the area of a region in a blue sky color on the image is equal to or more than a threshold. If the area of the region in the blue sky color is equal to or more than the threshold, the scene determination unit 1107 determines that the background of the photographing scene is a blue sky. The scene determination unit 1107 also analyzes the luminance information from the luminance detection unit 1602 and the chrominance information from the chrominance information detection unit 1603. As a result, if the scene determination unit 1107 determines that the luminance on the image satisfies a specified histogram distribution or variance condition, the background of the photographing scene is determined to be a night view. For example, the luminance of the image in a dark scene such as a night view is mostly occupied by a low luminance portion with a high luminance portion being singly found. The scene determination unit 1107 also analyzes the luminance information from the luminance detection unit 1602 and the chrominance information from the chrominance information detection unit 1603, and determines whether or not both the average chroma and the area of the high chroma region on the image are equal to or more than the thresholds. If these values are equal to or more than the thresholds, the scene determination unit 1107 determines that the photographing scene is a sharp scene.

Operation to determine an object in the photographing scene will be described next.

The scene determination unit 1107 analyzes the face information from the face detection unit 1601. If a face has been detected from the image signal, the scene determination unit 1107 determines that the object in the photographing scene is a person.

The scene determination unit 1107 determines both the background and the object of the scene as described above, combines these determination results, and outputs the combined one determination result to the system control unit 1108.

Figure 17:
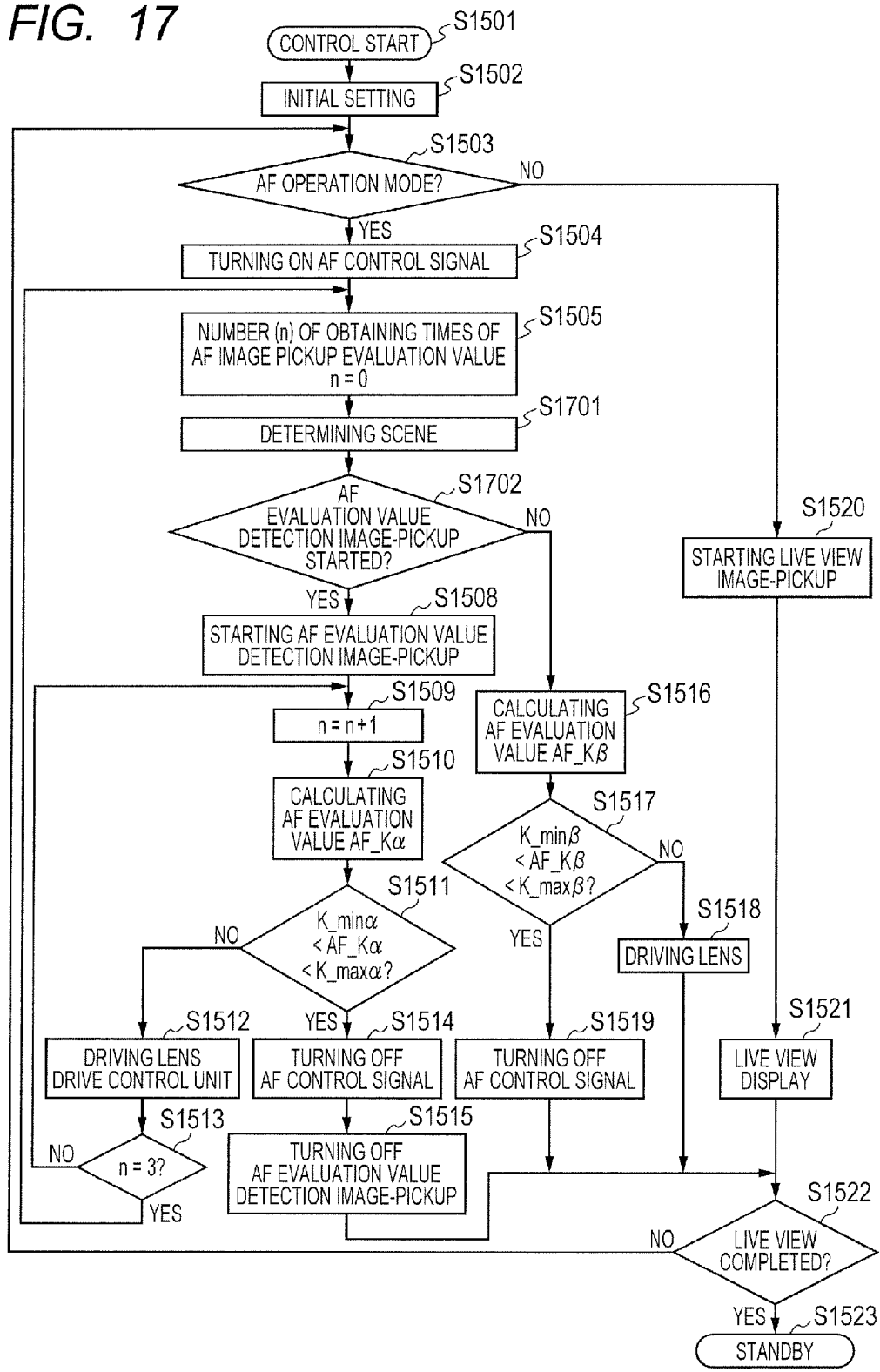
FIG. 17 is a flow chart illustrating operation in the AF mode in the image pickup apparatus according to the fifth embodiment of the present invention.

Next, detailed operation in the AF evaluation mode in the image pickup apparatus according to the present embodiment will be described with reference to the flow chart of FIG. 17. For description of the detailed operation of the present embodiment, a face information detection value detected from the image for live view is defined as Xl, a luminance information detection value is defined as Yl, and a chrominance information detection value is defined as Zl. Only the operation aspects which are different from the fourth embodiment will be described.

The scene determination unit 1107 compares the detection values of each detected information with corresponding expected values: face information X; luminance information Y; and chrominance information Z, and selects an AF evaluation value AF_Kα or AF_Kβ as illustrated in FIG. 18. In accordance with the selection result, a branch in step S1702 is determined.

In step S1701, the face detection unit 1601, the luminance detection unit 1602, and the chrominance information detection unit 1603 detect face information Xl, luminance information Yl, and chrominance information Zl from an obtained image for live view. In S1702, an image-pickup evaluation value to be reflected on a subsequent photographing is determined, as shown in the table of FIG. 18, from each of the information values detected from the image for image-pickup evaluation value detection and the image for live view by the scene determination unit 1107 in S1701.

For example, assume that the respective information values are in a relationship as shown below in one example:

Face information value: Xl>X

Luminance information value: Yl>Y

Chrominance information value: Zl>Z

In this case, in step S1702, AF evaluation value detection image-pickup is started (i.e., branches to Yes), so that the operation proceeds to step S1508, and the system control unit 1108 increments variable n by 1 (step S1509). Subsequent processing is the same as that of the fourth embodiment.

In another example, assume that the respective information values are in an relationship as shown below:

Face information value: Xl≤X

Luminance information value: Yl≤Y

Chrominance information value: Zl≤Z

In this case, in step S1702, AF evaluation value detection image-pickup is not started (i.e., branches to No), so that the operation proceeds to S1516 to detect an AF evaluation value AF_Kβ from the picked up image for live view. Subsequent processing is the same as that of the fourth embodiment. For other scene determination, the relationship as shown in FIG. 18 is used.

As described in the foregoing, the present embodiment is premised on the image pickup apparatus that includes an image pickup element capable of performing the image-pickup for live view and the image-pickup for image-pickup evaluation value detection at the same time during one frame period. In accordance with the determination result of the photographing scene based on the luminance/chrominance/face information, the image to detect an AF evaluation value is selected from one of the image for AF evaluation value and the image for live view. Consequently, at the time of photographing an object in a light scene, a time lag in performing AF evaluation can be reduced, while in a dark scene, AF evaluation value precision can be enhanced.

Moreover, in the present embodiment, when the scene determination is performed, the face information, the luminance information, and the chrominance information are detected from each of the image for image-pickup evaluation value detection and the image for live view. However, the present invention is not limited to this configuration. If the sensibility described in the first embodiment is detected, and the result thereof is used as one factor of scene determination, the time lag in detecting the AF evaluation value can further reduced, and the speed in detecting the AF evaluation value can further optimized.

Further, in the present embodiment, the image-pickup evaluation value is determined from a picked up image when at least two information pieces, out of the face information, luminance information and chrominance information pieces which are necessary for performing scene determination, are large information values. However, the present invention is not limited thereto. The respective information values may be weighted according to the image-pickup evaluation value and be compared.

Sixth Embodiment

Now, a sixth embodiment of the present invention is described. The present embodiment is configured to form the image-pickup evaluation value detection unit 1106 not in the outside of the image sensor 1102 but in the inside, such as in the pixel drive unit on the second chip 121 of FIG. 12A.

Figure 19:
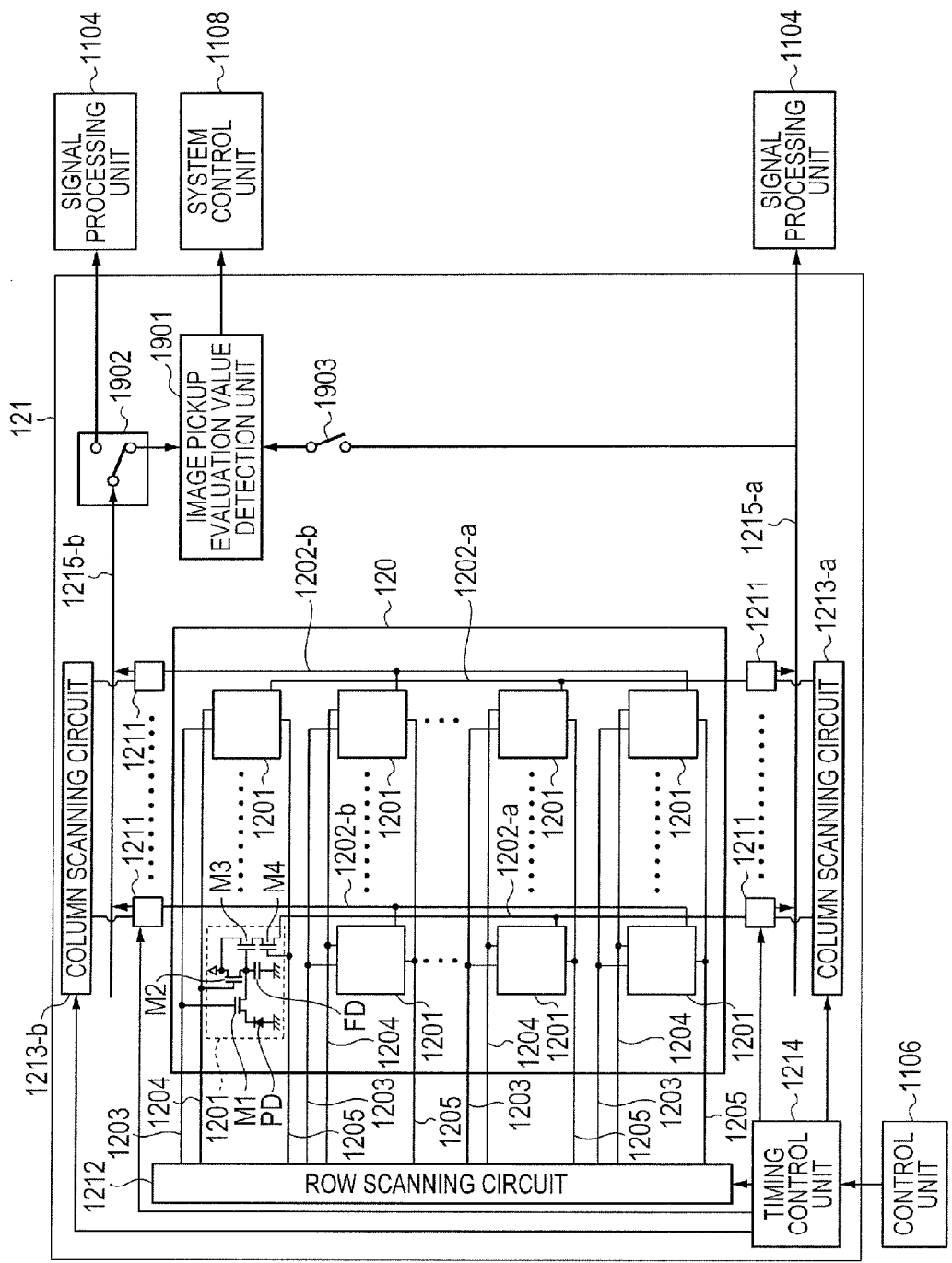
FIG. 19 illustrates the configuration of an image pickup apparatus according to a sixth embodiment of the present invention.

FIG. 19 is a block diagram of the image sensor 1102 incorporating an image-pickup evaluation value detection unit. In FIG. 19, component members identical to those in FIGS. 12A and 12B are designated by identical reference numerals.

In the drawing, an image-pickup evaluation value detection unit 1901 is configured to detect an image-pickup evaluation value, such as an AF evaluation value (auto-focus data), and to output only the detected evaluation value to the system control unit 1106. The image-pickup evaluation value detection unit 1901 operates according to the timing controlled by the system control unit 1108 based on the contrast information and the phase-difference information which are obtained from an image signal obtained in the image pickup element 1102.

Switches 1902 and 1903 are controlled by the system control unit 1108. The switches 1902 and 1903 are configured to switch an image signal for image-pickup evaluation value detection and an image signal for live view based on a determination result of the scene determination unit 1107, so that one of the signals is selectively input to the image-pickup evaluation value detection unit 1901 at the time of detecting the image-pickup evaluation value. The switch 1902 is to select output destination of the signals of the pixels corresponding to the image-pickup evaluation value illustrated in FIG. 13, the output destination being one of the signal processing unit 1103 and the image-pickup evaluation value detection unit 1901. The switch 1903 is a switch to be turned on when the signals of the pixels corresponding to the rows to be selected for live view illustrated in FIG. 13 are used for the image-pickup evaluation value.

Operation of the image sensor of FIG. 19, when used in the image pickup apparatus according to the fourth embodiment, will be described with reference to the flow chart of FIG. 15.

In step S1503, AF operation is started. As described in the fourth embodiment, if the live view exposure amount Ev satisfies Formula (1) in step S1507 (YES), the operation proceeds to step S1508, and image-pickup for AF evaluation value detection is started. At this time, the switch 1902 is connected to the image-pickup evaluation value detection unit 1901 side, while the switch 1903 is turned off.

After AF evaluation image-pickup is started, the system control unit 1108 increments the variable n by 1 (step S1509). Then, the image-pickup evaluation value detection unit 1901 detects an AF evaluation value AF_Kα from the image for AF evaluation value.

If the live view exposure amount Ev does not satisfy Formula (1) in step S1507 (No), the operation proceeds to S1516. In S1516, the switch 1903 is turned on, and the image-pickup evaluation value detection unit 1901 detects an AF evaluation value AF_Kβ from the image signal for live view. At this time, the switch 1902 is connected to the signal processing unit 1103 side, but the operation for AF evaluation value is not performed and so pixel signals are not output to the signal processing unit. Moreover, since the image-pickup evaluation value detection unit 1901 transfers only the AF evaluation value to the system control unit 1108, the amount of data transfer to the outside can be reduced as compared with the fourth embodiment, so that power consumption can be decreased. Since the subsequent operation is the same as the operation in the first embodiment, the description thereof is omitted. Note that the same operation applies when the image sensor of FIG. 19 is used for the image pickup apparatus according to the fifth embodiment.

In the aforementioned sixth embodiment, the image-pickup evaluation value detection unit is formed in the image sensor, so that the amount of data transfer at the time of image-pickup evaluation value detection in the first and second embodiments can be reduced. As a result, power consumption can be decreased.

Other Embodiments

Embodiments of the present invention can also be realized by a computer of a system or apparatus that reads out and executes computer executable instructions recorded on a storage medium (e.g., non-transitory computer-readable storage medium) to perform the functions of one or more of the above-described embodiment(s) of the present invention, and by a method performed by the computer of the system or apparatus by, for example, reading out and executing the computer executable instructions from the storage medium to perform the functions of one or more of the above-described embodiment(s). The computer may comprise one or more of a central processing unit (CPU), micro processing unit (MPU), or other circuitry, and may include a network of separate computers or separate computer processors. The computer executable instructions may be provided to the computer, for example, from a network or the storage medium. The storage medium may include, for example, one or more of a hard disk, a random-access memory (RAM), a read only memory (ROM), a storage of distributed computing systems, an optical disk (such as a compact disc (CD), digital versatile disc (DVD), or Blu-ray Disc (BD)™), a flash memory device, a memory card, and the like.

While the present invention has been described with reference to embodiments, it is to be understood that the invention is not limited to the disclosed embodiments. The scope of the following claims is to be accorded the broadest interpretation so as to encompass all such modifications and equivalent structures and functions.

This application claims the benefit of Japanese Patent Application No. 2012-288036, filed Dec. 28, 2012, Japanese Patent Application No. 2013-136083, filed Jun. 28, 2013, and Japanese Patent Application No. 2013-137031, filed Jun. 28, 2013, which are hereby incorporated by reference herein in their entirety.

What is claimed is:

1. An image pickup element for picking up an optical image focused thereon and outputting an image signal corresponding to the optical image, comprising:
a first chip including a plurality of pixels arrayed in a matrix, configured to output an image signal corresponding to the optical image; and
a second chip including a control information generation unit and an output unit,
wherein the control information generation unit is configured to generate control information to be used for image-pickup in accordance with a first image signal which is obtained from a first pixel group among the plurality of pixels and output the control information in synchronization with a first synchronization signal, and the output unit is configured to output, as an image display signal for image display, a second image signal which is obtained from a second pixel group among the plurality of pixels in synchronization with a second synchronization signal different from the first synchronization signal.

2. The image pickup element according to claim 1, wherein the first pixel group contains pixels from rows of the array in the matrix that are different from rows of the array containing pixels of the second pixel group.

3. The image pickup element according to claim 1, wherein the second chip comprises a switching unit configured to selectively provide the first image signal to the control information generation unit, and wherein the switching unit is configured to, in a preparation state before image-pickup is performed, provide the first image signal to the control information generation unit.

4. The age pickup element according to claim 3, wherein when image-pickup is performed, the switching unit is further configured to provide the first image signal to the output unit, and the output unit is configured to output the first image signal and the second image signal as an image-pickup signal.

5. An image pickup apparatus, comprising:
an image pickup element for picking up an optical image focused thereon and outputting an image signal corresponding to the optical image, the image pickup element including a first chip including a plurality of pixels arrayed in a matrix, configured to output an image signal corresponding to the optical image, and a second chip including a control information generation unit and an output unit, wherein the control information generation unit is configured to generate control information to be used for image-pickup in accordance with a first image signal which is obtained from a first pixel group among the plurality of pixels and output the control information in synchronization with a first synchronization signal, and the output unit is configured to output, as an image display signal for image display, a second image signal which is obtained from a second pixel group among the plurality of pixels in synchronization with a second synchronization signal different from the first synchronization signal;
a control unit configured to control, upon receipt of the control information, image pickup in accordance with the control information; and
a display control unit configured to perform live-view display in accordance with the image display signal.

6. The image pickup apparatus according to claim 5, further comprising:
a readout control unit configured to read out the first pixel group at a first frame rate and to read out the second pixel group at a second frame rate that is less than the first frame rate.

7. The image pickup apparatus according to claim 6, wherein the readout control unit is configured to operate in both a first image-pickup mode for reading out the first pixel group and a second image-pickup mode for reading out the second pixel group.

8. The image pickup apparatus according to claim 7 wherein the readout control unit is configured to start the first image-pickup mode and the second image-pickup mode simultaneously.

9. The image pickup apparatus according to claim 5, wherein the control information generation unit is configured to generate, as the control information, an auto-focus evaluation value for use in performing auto-focus control, and the control unit is configured to perform drive control of a focus lens in accordance with the auto-focus evaluation value.

10. The image pickup apparatus according to claim 7 wherein the control information generation unit is configured to generate, as the control information, an auto-focus evaluation value for use in performing auto-focus control, the control unit is configured to determine whether or not the auto-focus evaluation value satisfies a predetermined evaluation condition, and if the control unit determines that the evaluation condition has been satisfied, the readout control unit is configured to terminate the first image-pickup mode.

11. The image pickup apparatus according to claim 5, wherein the control information generation unit is configured to generate, as the control information, a white balance coefficient to be used in performing white balance correction, and the control unit is configured to perform correction processing of the image signal output from the image pickup element in accordance with the generated white balance coefficient.

12. The image pickup apparatus according to claim 5, further comprising:
a light emission unit configured to emit light to illuminate an object for image pickup,
wherein the control information generation unit is configured to generate, as the control information, a light emission control amount for controlling a light emission amount of the light emission unit, and
the control unit is configured to, when image-pickup is performed by using the light emission unit, make the light emission unit perform a pre-emission to obtain the light emission control amount from the control information generation unit, and then make the light emission unit perform a main light emission in accordance with the light emission control amount to perform image-pickup.

13. An image pickup apparatus, comprising:
the image pickup element according to claim 4, where the control information generation unit is configured to generate, as the control information, an auto-focus evaluation value to be used in performing auto-focus control;
a control unit configure to perform, upon reception of the auto-focus evaluation value, drive control of a focus lens in accordance with the auto-focus evaluation value; and
a display control unit configured to perform live-view display in accordance with the image display signal,
wherein the control unit is further configured to, when an auto-focus mode for performing the auto-focus control is set, control the switching unit to provide the first image signal to the control information generation unit.

14. A method for controlling an image pickup apparatus including an image pickup element for picking up an optical image focused thereon and outputting an image signal corresponding to the optical image, the image pickup element including a first chip including a plurality of pixels arrayed in a matrix, configured to output an image signal corresponding to the optical image, and a second chip including a control information generation unit and an output unit, wherein the control information generation unit is configured to generate control information to be used for image-pickup in accordance with a first image signal which is obtained from a first pixel group among the plurality of pixels and output the control information in synchronization with a first synchronization signal, and the output unit is configured to output, as an image display signal for image display, a second image signal which is obtained from a second pixel group among the plurality of pixels in synchronization with a second synchronization signal different from the first synchronization signal, the method comprising:
controlling, upon reception of the control information, image-pickup in accordance with the control information; and
performing live-view display in accordance with the image display signal.

15. A non-transitory computer readable storage medium for causing one or more processors included in an image pickup apparatus to execute a method of controlling the image pickup apparatus, the image pickup apparatus including the image pickup element for picking up an optical image focused thereon and outputting an image signal corresponding to the optical image, the image pickup element including a first chip including a plurality of pixels arrayed in a matrix, configured to output an image signal corresponding to the optical image, and a second chip including a control information generation unit and an output unit, wherein the control information generation unit is configured to generate control information to be used for image-pickup in accordance with a first image signal which is obtained from a first pixel group among the plurality of pixels and output the control information in synchronization with a first synchronization signal, and the output unit is configured to output, as an image display signal for image display, a second image signal which is obtained from a second pixel group among the plurality of pixels in synchronization with a second synchronization signal different from the first synchronization signal, the method comprising:
controlling, upon reception of the control information, image-pickup in accordance with the control information; and
performing live-view display in accordance with the image display signal.

16. The image pickup apparatus according to claim 8, wherein the control information generation unit is configured to generate, as the control information, an auto-focus evaluation value for use in performing auto-focus control,
the control unit is configured to determine whether or not the auto-focus evaluation value satisfies a predetermined evaluation condition, and
if the control unit determines that the evaluation condition has been satisfied, the readout control unit is configured to terminate the first image-pickup mode.

17. The image pickup element according to claim 1, the second chip further comprising a converter configured to convert the image signal into a digital signal.

18. The image pickup element according to claim 1, wherein the first chip and the second chip are arranged in a stacked structure.

19. The image pickup element according to claim 18, wherein the first chip is positioned on the side at which the optical image is received.

* * * * *